US009545600B2

(12) United States Patent
Miller et al.

(10) Patent No.: US 9,545,600 B2
(45) Date of Patent: Jan. 17, 2017

(54) ACCELERATING TRANSPORT THROUGH GRAPHENE MEMBRANES

(71) Applicant: Empire Technology Development LLC, Wilmington, DE (US)

(72) Inventors: Seth A. Miller, Englewood, CO (US); Gary L. Duerksen, Ward, CO (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 14/703,730

(22) Filed: May 4, 2015

(65) Prior Publication Data

US 2015/0231557 A1    Aug. 20, 2015

Related U.S. Application Data

(63) Continuation of application No. 13/640,272, filed as application No. PCT/US2012/022858 on Jan. 27, 2012, now Pat. No. 9,056,282.

(51) Int. Cl.
*B01D 53/22* (2006.01)
*B01D 67/00* (2006.01)
(Continued)

(52) U.S. Cl.
CPC ........... *B01D 53/229* (2013.01); *B01D 53/228* (2013.01); *B01D 67/0069* (2013.01);
(Continued)

(58) Field of Classification Search
CPC ..... B01D 53/22; B01D 53/229; B01D 53/228; B01D 67/0069; B01D 67/0072; B01D 69/06; B01D 71/021; B01D 2325/12; B01D 2325/20
See application file for complete search history.

(56) References Cited

U.S. PATENT DOCUMENTS 3,155,467 A  *  11/1964  Yamamoto ............. B01D 53/22
                                                          420/463
5,604,047 A      2/1997   Bellows et al.
(Continued)

FOREIGN PATENT DOCUMENTS

EP          2362459 A1     8/2011
WO       2011046706 A1     4/2011

OTHER PUBLICATIONS

Jiang "Porous Graphene as the Ultimate Membrane for Gas Separation" 2009 American Chemical Society vol. 9 No. 12 4019-4024 Nano Letters.*

(Continued)

*Primary Examiner* — Anthony Shumate
(74) *Attorney, Agent, or Firm* — Turk IP Law, LLC

(57) ABSTRACT

Technologies are generally described for a membrane that may incorporate a graphene layer perforated by a plurality of nanoscale pores. The membrane may also include a gas sorbent that may be configured to contact a surface of the graphene layer. The gas sorbent may be configured to direct at least one gas adsorbed at the gas sorbent into the nanoscale pores. The nanoscale pores may have a diameter that selectively facilitates passage of a first gas compared to a second gas to separate the first gas from a fluid mixture of the two gases. The gas sorbent may increase the surface concentration of the first gas at the graphene layer. Such membranes may exhibit improved properties compared to conventional graphene and polymeric membranes for gas separations, e.g., greater selectivity, greater gas permeation rates, or the like.

18 Claims, 27 Drawing Sheets

(51) Int. Cl.
B01D 69/06 (2006.01)
B01D 71/02 (2006.01)
(52) U.S. Cl.
CPC ......... B01D 67/0072 (2013.01); B01D 69/06 (2013.01); B01D 71/021 (2013.01); B01D 2325/12 (2013.01); B01D 2325/20 (2013.01)

(56) References Cited

U.S. PATENT DOCUMENTS

| | | | |
|---|---|---|---|
| 9,056,282 B2* | 6/2015 | Miller | B01D 67/0039 |
| 2002/0061431 A1 | 5/2002 | Koyama et al. | |
| 2002/0141920 A1* | 10/2002 | Alvin | B01D 53/22 422/211 |
| 2003/0089228 A1 | 5/2003 | Kulprathipanja et al. | |
| 2009/0056802 A1 | 3/2009 | Ran Bani | |
| 2009/0072192 A1 | 3/2009 | Seal et al. | |
| 2009/0283475 A1 | 11/2009 | Hylton et al. | |
| 2009/0291270 A1 | 11/2009 | Zettl et al. | |
| 2010/0258786 A1 | 10/2010 | Wang et al. | |
| 2010/0320437 A1 | 12/2010 | Gordon et al. | |
| 2011/0056892 A1 | 3/2011 | Strauss et al. | |
| 2011/0186789 A1 | 8/2011 | Samulski et al. | |
| 2011/0206932 A1 | 8/2011 | Waki et al. | |
| 2012/0048181 A1 | 3/2012 | Barker et al. | |
| 2012/0183133 A1 | 7/2012 | Lindstrom et al. | |
| 2012/0255899 A1 | 10/2012 | Choi et al. | |
| 2013/0156678 A1 | 6/2013 | Banerjee et al. | |
| 2013/0192460 A1 | 8/2013 | Miller et al. | |
| 2013/0277305 A1 | 10/2013 | Stetson et al. | |
| 2013/0323613 A1 | 12/2013 | Yeung et al. | |
| 2014/0030465 A1 | 1/2014 | Miller et al. | |
| 2014/0030482 A1 | 1/2014 | Miller et al. | |
| 2014/0151288 A1 | 6/2014 | Miller et al. | |
| 2014/0154464 A1 | 6/2014 | Miller et al. | |
| 2014/0154811 A1 | 6/2014 | Sjong et al. | |
| 2014/0352537 A1* | 12/2014 | Bonnet | B01D 53/04 95/131 |

OTHER PUBLICATIONS

Scheuermann "Palladium Nanoparticles on Graphite Oxide and Its Functionalized Graphene Derivatives as Highly Active Catalysts for the Suzuki-Miyaura Coupling Reaction" J. Am. Chem. Soc. 2009, 131, 8262-8270.*

"Pureguard," accessed at https://web.archive.org/web/20111213012640/http://www.pureguard.net/cm/Home.html, accessed on Aug. 14, 2014, p. 1.
Jiang et al., "Porous Graphene as the Ultimate Membrane for Gas Separation", Nano Lett, 2009, 9 (12), pp. 4019-4024. Jul. 9, 2009.
International Search Report and Written Opinion for PCT/US2012/22858, filed Jan. 27, 2012, mailed on May 16, 2012.
Hua et al., A glucose biosensor based on electrodeposition of palladium nanoparticles and glucose oxidase onto Nafion-solubilized carbon nanotube electrode, Biosensors and Bioelectronics, vol. 20, Issue 11, May 15, 2005, pp. 2341-2346.
Palladium Nanoparticles: American Elements Supplier & Tech info http, http://www.americanelements.com/pdnp.html[Oct. 9, 2012 2:15:05 AM].
Bera, et al., "Kinetics and Growth Mechanism of Electrodeposited Palladium Nanocrystallites", J. Phys. Chem. 2004,108,556-562.
Hong, et al. "Hydrogen purification using a SAP0-34 membrane", Journal of Membrane Science, vol. 307, Issue 2, Jan. 15, 2008, pp. 277-283.
Perry, R.H.; Green, D.W. (1997). Perry's Chemical Engineers' Handbook (7th Edition). (pp. 22-64). McGraw-Hill.
Non-Final Office Action mailed Jul. 30, 2014, in U.S. Appl. No. 13/640,272, Seth A. Miller, filed Oct. 9, 2012.
International Preliminary Report on Patentability for PCT/US2012/022858 filed Jan. 27, 2012, mailed on Aug. 7, 2014, issued Jul. 29, 2014.
Polyakova, E., et al., "Fabrication of nanoporous graphene membranes and metal nanoparticles," accessed at http://www.ctsaip.org/details.cfm?id=24507813, accessed on Aug. 14, 2014, p. 1.
Xue, L., et al., "Modeling of enhanced penetrant diffusion in nanoparticle-polymer composite membranes," vol. 286, Issues 1-2, pp. 293-300 (2006).
Schrier, J., et al., "Helium Separation Using Porous Graphene Membranes," J. Phys. Chem. Lett., vol. 1, Issue 15, pp. 2284-2287 (2010).
Florin, N. H., and Harris, A. T., "Reactivity of CaO derived from nano-sized CaCO3 particles through multiple CO2 capture-and-release cycles," Chemical Engineering Science, vol. 64, Issue 2, pp. 187-191 (2009).
"Palladium nanoparticles 1-5 nm," Accessed at http://www.antibodyresearch.com/nbi281027.html, Accessed on Aug. 19, 2014, p. 1.
Johnson, Chad A. Functional and Structural Characterization of Nanoparticulate Transition Metal Complexes Prepared Using Precipitation with Compressed C02 as an Antisolvent, available at http://kuscholarworks.ku.edu/dspace/bitstream/1808/3998/1 /umi-ku-2462_1.pdf, Apr. 14, 2008, 145 pages.

* cited by examiner

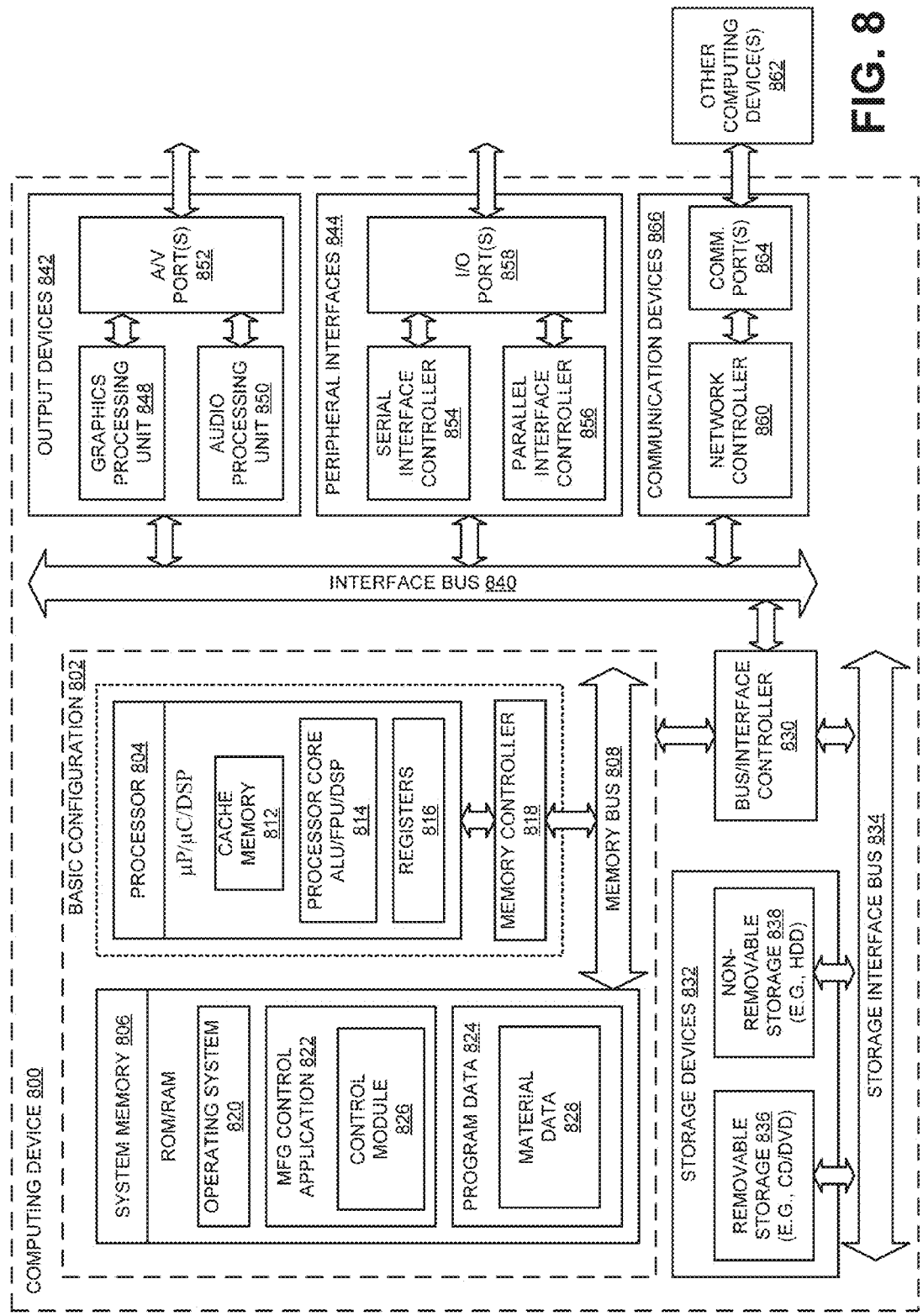

ACCELERATING TRANSPORT THROUGH GRAPHENE MEMBRANES

CROSS-REFERENCE TO RELATED APPLICATIONS

This application is a continuation and claims benefit under 35 U.S.C §120 of U.S. patent application Ser. No. 13/640,272 filed on Oct. 9, 2012, now U.S. Pat. No. 9,056,282, which is the U.S. National Stage filing under 35 U.S.C §371 of PCT Application No. PCT/US12/22858 filed on Jan. 27, 2012. The U.S. Patent Application and the PCT Application are herein incorporated by reference in their entireties.

BACKGROUND

Unless otherwise indicated herein, the materials described in this section are not prior art to the claims in this application and are not admitted to be prior art by inclusion in this section.

Porous graphene is considered to be a desirable membrane for gas separation. Theoretical and experimental studies indicate that atom-scale holes in the graphene lattice may provide significant selectivity for separating gases based on molecular size. Further, monolayer graphene, at one atom thick, is a desirable candidate because the gas permeation rate through a membrane increases with decreasing membrane thickness.

Porous graphene may be imagined as a rigid two-dimensional sieve, with molecule-sized pores. Molecules small enough to transit the pores may cross the membrane, whereas larger molecules may be unable to cross the membrane. Beyond size, two other mechanisms have been proposed to describe the travel of molecules through such membranes. First, in the gas phase, molecules which are small enough to actually pass through the membrane may still be restricted by statistics if they are not sufficiently aligned with a pore in terms of molecular orientation, momentum, direction of travel, etc. Second, at the graphene surface, a gas may absorb onto the graphene membrane itself, and may travel by diffusion across the surface to a pore.

All things being equal, the second mechanism could have advantages over the first mechanism since adsorbing the gas removes many degrees of freedom and removes the statistics of alignment with the pores as a factor. However, gas sorption onto a graphene surface is weak, especially at high temperatures. Thus, sorption to the graphene may not be accessible for many potentially useful applications, such as purification of hydrogen produced from water, or purification of hydrogen from the flue gas of coal plants, both of which may experience increased efficiency when conducted at high temperatures.

The present disclosure appreciates that facilitating molecular flux through porous graphene, e.g., for use in separation membranes, may be a complex undertaking.

SUMMARY

The following summary is illustrative only and is not intended to be in any way limiting. In addition to the illustrative aspects, embodiments, and features described above, further aspects, embodiments, and features will become apparent by reference to the drawings and the following detailed description.

The present disclosure generally describes membranes that include perforated graphene layers and gas sorbents. An example membrane may include a graphene layer perforated by a plurality of nanoscale pores. An example membrane may also include a gas sorbent that may be configured to contact a surface of the graphene layer. The gas sorbent may be configured to direct at least one gas adsorbed at the gas sorbent into the nanoscale pores.

The present disclosure also generally describes example methods of forming membranes. An example method of forming may include providing a graphene layer that may be perforated by a plurality of nanoscale pores. Some example methods of forming may also include contacting a gas sorbent to a surface of the graphene layer. Various example methods of forming may further include configuring the gas sorbent to increase a surface concentration of at least one gas at the graphene layer.

The present disclosure also generally describes methods of separating a gas from a fluid mixture. An example method of separating may include providing a fluid mixture that includes a first gas and a second gas. A molecule of the second gas may be larger than a molecule of the first gas. Some example methods of separating may also include providing a graphene layer that may be perforated by a plurality of nanoscale pores. Each of the nanoscale pores may be characterized by a diameter that may selectively facilitate passage of the first gas compared to the second gas. Various example methods of separating may further include increasing the surface concentration of the first gas at the graphene layer by contacting the fluid mixture to a gas sorbent at the graphene layer. Example methods of separating may also include selectively separating the first gas from the second gas according to size by employing the nanoscale pores perforated in the graphene layer.

The present disclosure also generally describes an example computer-readable storage medium having example instructions stored thereon for making an example membrane. The example instructions may include providing a graphene layer that may be perforated by a plurality of nanoscale pores. Some example instructions may also include contacting a gas sorbent to a surface of the graphene layer via one or more of: electrochemical deposition from a solution of the gas sorbent; chemical precipitation from a solution of the gas sorbent; dip coating, spin coating, contact printing, or jet coating of a suspension of gas sorbent nanoparticles; dip coating, spin coating, contact printing, or jet coating of a solution of soluble gas sorbent; atomic vapor deposition of the gas sorbent; atomic layer deposition of the gas sorbent; chemical vapor deposition of the gas sorbent; physical vapor deposition of the gas sorbent; and/or electrostatic deposition of particles of the gas sorbent.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 8 illustrates a general purpose computing device that may be used to control the automated machine of FIGS. 7A and 7B in making an example membrane or example perforated graphene monolayer.

Figure 1A:
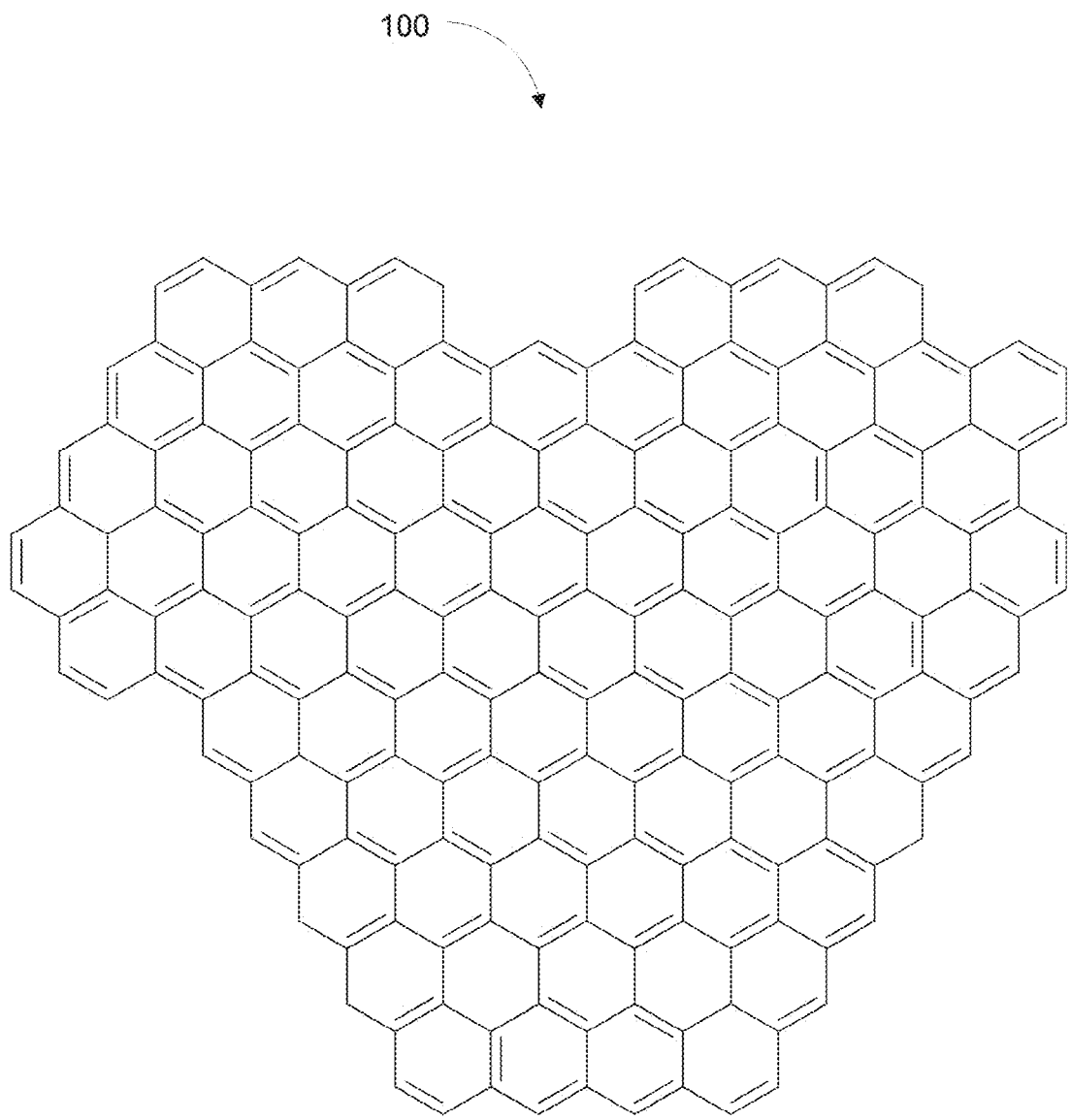
FIG. 1A is a conceptual drawing of an example graphene monolayer, illustrating the hexagonal lattice of carbon atoms and aromatic bonds characteristic of graphene.

all arranged in accordance with at least some embodiments as described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to compositions, methods, apparatus, systems, devices, and/or computer program products related to manufacturing or using membranes that include perforated graphene layers and gas sorbents, for example, membranes which may be used in gas separation.

Briefly stated, technologies are generally described for a membrane that may include a graphene layer perforated by a plurality of nanoscale pores. An example membrane may also include a gas sorbent that may be configured to contact a surface of the graphene layer. The gas sorbent may be configured to direct at least one gas adsorbed at the gas sorbent into the nanoscale pores. In some examples, the nanoscale pores may have a diameter that selectively facilitates passage of a first gas compared to a second gas to separate the first gas from a fluid mixture of the two gases. In some examples, the gas sorbent may increase the surface concentration of the first gas at the graphene layer. Such example membranes may exhibit improved properties compared to conventional graphene and polymeric membranes for gas separations, e.g., greater selectivity, greater gas permeation rates, or the like.

FIG. 1A is a conceptual drawing of an example graphene monolayer 100. FIG. 1A illustrates the hexagonal lattice of carbon atoms and aromatic bonds characteristic of graphene. The placement of the carbon-carbon double bonds in example graphene monolayers described herein, for example, in monolayer 100, is intended to be illustrative of graphene and is not intended to be limiting.

Figure 1B:
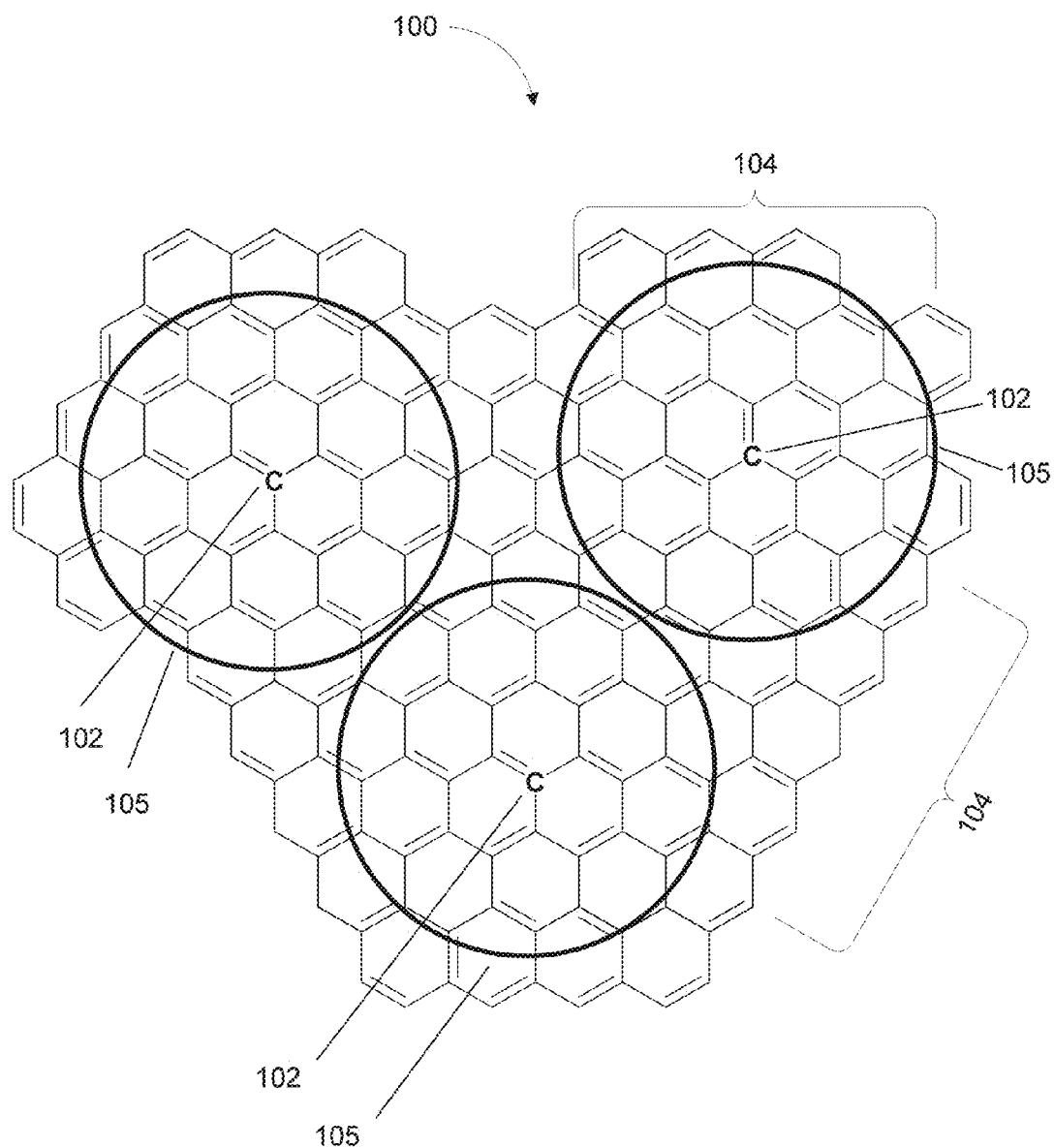
FIG. 1B is a conceptual drawing of example graphene monolayer, showing one graphene carbon atom to be removed from a plurality of locations.

FIG. 1B is a conceptual drawing of example graphene monolayer 100, showing one graphene carbon atom 102 to be removed from a plurality of locations in example graphene monolayer 100. Removal of graphene carbon atoms 102 forms example graphene monolayer 106 in FIG. 1C. FIG. 1B also shows a minimum steric separation 104 between adjacent locations in example graphene monolayer 100. Minimum steric separation 104 may also correspond to the diameter of a circle 105 around graphene carbon atom 102. Circle 105 may correspond to a minimum steric radius $r_R$ of an R group in a bulky chemical perforation reagent R-Het*. Methods of chemical perforation using bulky reagents R-Het* are described further in the discussion of FIGS. 4A-5E.

Figure 1C:
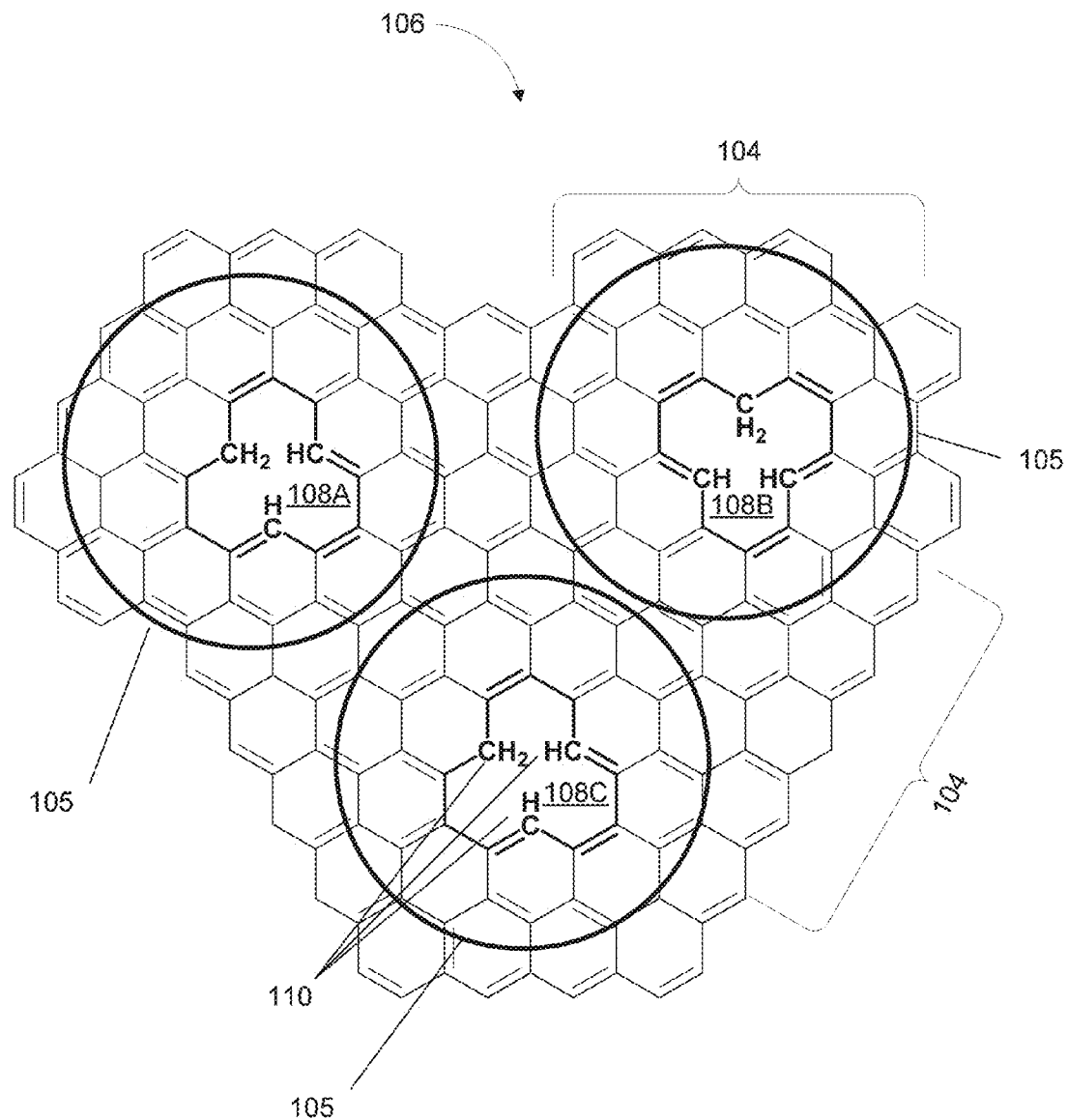
FIG. 1C is a conceptual drawing of an example perforated graphene monolayer, including a plurality of discrete pores which may have a substantially uniform pore size characterized by one carbon vacancy defect per pore.

FIG. 1C is a conceptual drawing of an example perforated graphene monolayer 106. A plurality of discrete pores 108 are chemically perforated in example graphene monolayer 106. Discrete pores 108 may have a substantially uniform pore size characterized by one or more carbon vacancy defects in graphene monolayer 106. In various examples, each discrete pore 108 may include hydrogen-passivated carbon atoms 110. FIG. 1C also shows a minimum steric separation 104 between adjacent discrete pores 108. Minimum steric separation 104 may also correspond to the diameter of circle 105 around discrete pores 108.

Figure 1D:
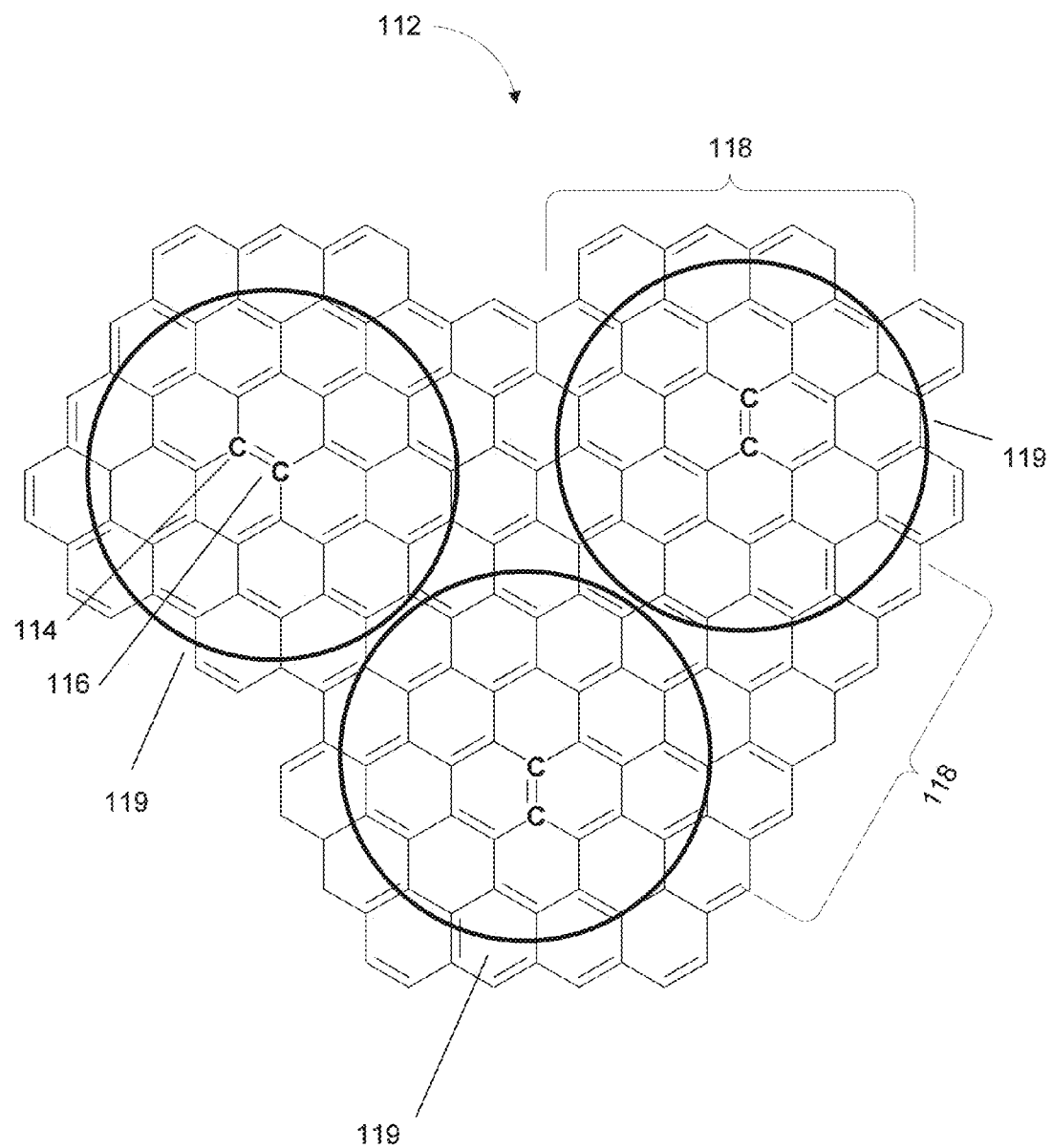
FIG. 1D is a conceptual drawing of an example graphene monolayer, showing graphene carbon atoms to be removed from each of a plurality of locations.
Figure 1E:
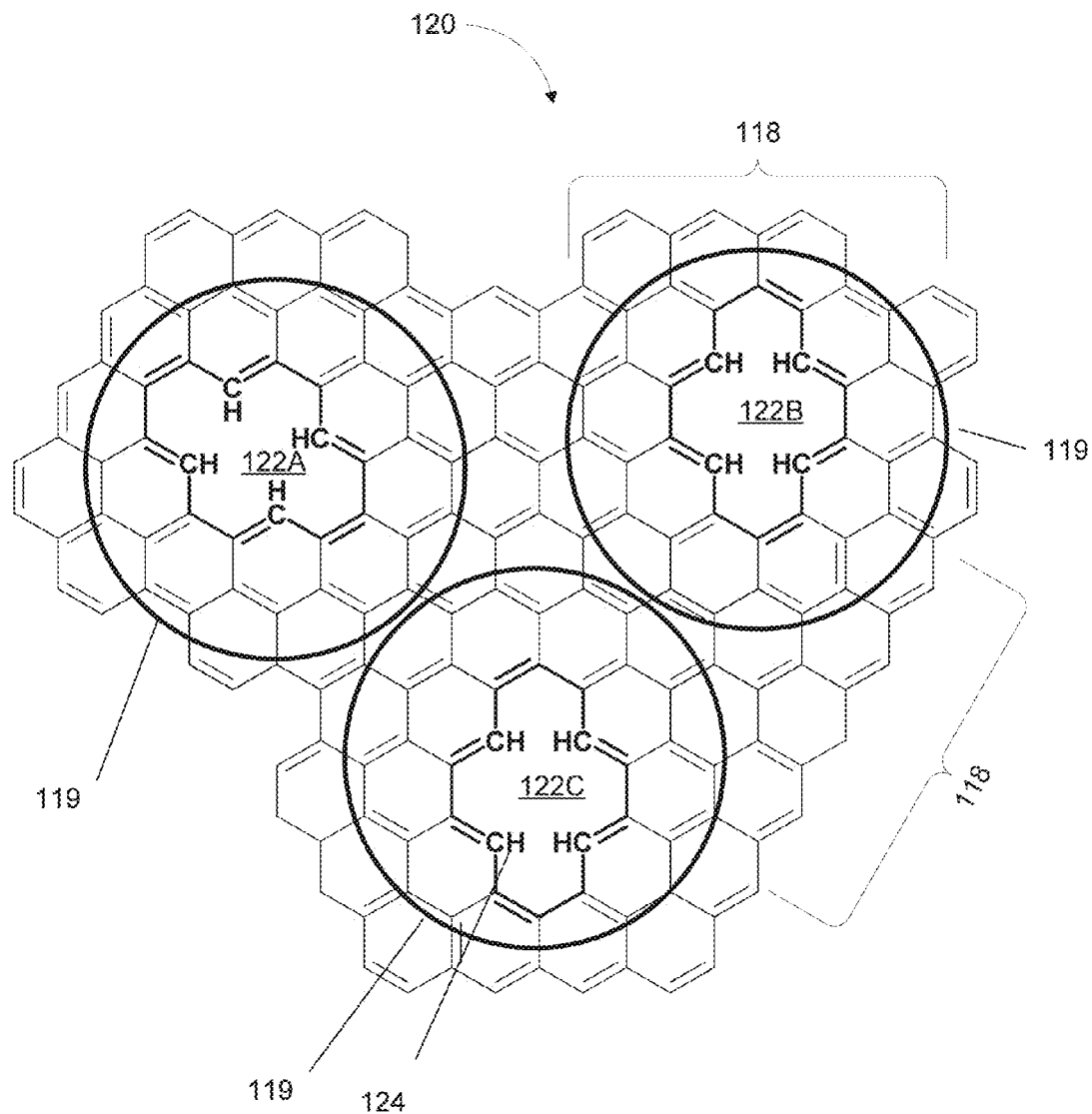
FIG. 1E is a conceptual drawing of an example perforated graphene monolayer, including a plurality of discrete pores which may have a substantially uniform pore size characterized by two carbon vacancy defects per pore.

FIG. 1D is a conceptual drawing of an example graphene monolayer 112, showing graphene carbon atoms 114 and 116 to be removed from each of a plurality of locations in example graphene monolayer 112, leading to example graphene monolayer 120 in FIG. 1E. FIG. 1D also shows a minimum steric separation 118 between adjacent locations in example graphene monolayer 112. Minimum steric separation 118 may also correspond to the diameter of a circle 119 around graphene carbon atoms 114 and 116. Circle 119 may correspond to a minimum steric radius $r_R$ of an R group in a bulky chemical perforation reagent R-Het*. Methods of chemical perforation using bulky reagents R-Het* are described further in the discussion of FIGS. 4A-5E.

FIG. 1E is a conceptual drawing of an example perforated graphene monolayer 120. A plurality of discrete pores 122 are chemically perforated in example graphene monolayer 120. Each of the plurality of discrete pores 122 may have a substantially uniform pore size characterized by two or more carbon vacancy defects in graphene monolayer 120. In various examples, each discrete pore 122 may include hydrogen-passivated carbon atoms 124. FIG. 1E also shows minimum steric separation 118 between adjacent discrete pores 122. Minimum steric separation 118 may also correspond to the diameter of circle 119 around discrete pores 122.

Figure 1F:
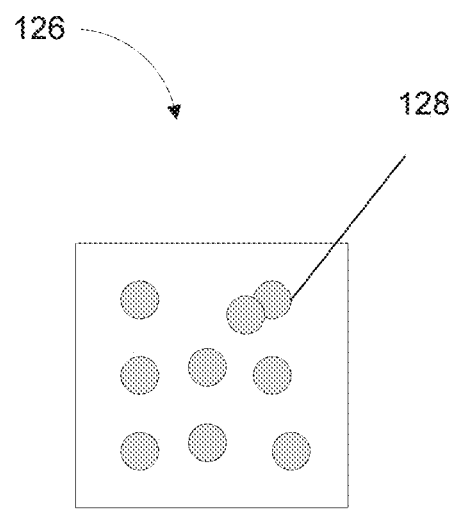
FIG. 1F is a conceptual drawing of an example perforated graphene monolayer.

FIG. 1F is a conceptual drawing of an example perforated graphene monolayer 126. A plurality of pores 128 are perforated in graphene monolayer 126. Pores 128 may be perforated in graphene monolayer 126 by any suitable method or combination of methods for forming pores in graphene. In various examples, graphene monolayer 126 may be formed via chemical methods, e.g., as described herein with respect to FIGS. 1B-1E and 3A-5E.

In some examples, pores 128 in graphene monolayer 126 may be formed via radiation methods, for example, by irradiation of graphene with: gamma rays; x-rays; laser irradiation, e.g., using an extreme ultraviolet laser; or the like. In some additional examples, pores 128 in graphene monolayer 126 may be formed via particle radiation or energetic particle beam methods, for example, by treatment of graphene with: alpha particles; beta particles; neutrons; directed ion beams such as electron beams or gallium ion beams; or the like. In still other examples, pores 128 in graphene monolayer 126 may be formed via mechanical methods, for example, by impingement with an atomic force microscopy probe, or the like. Pores such as 128 may be formed by a combination of methods, for example, pores have been formed by electron or ion beam irradiation followed by oxidative etching in an oxygen atmosphere to expand the pores.

Pores 128 may include discrete pores, which may have a substantially uniform pore size characterized by one or more carbon vacancy defects in graphene monolayer 120, such as pores 108 in FIG. 1C or pores 122 in FIG. 1E. In some examples, pores 128 may also include pores which overlap or which vary in size according to the method or combination of methods employed to form the pores.

Figure 2A:
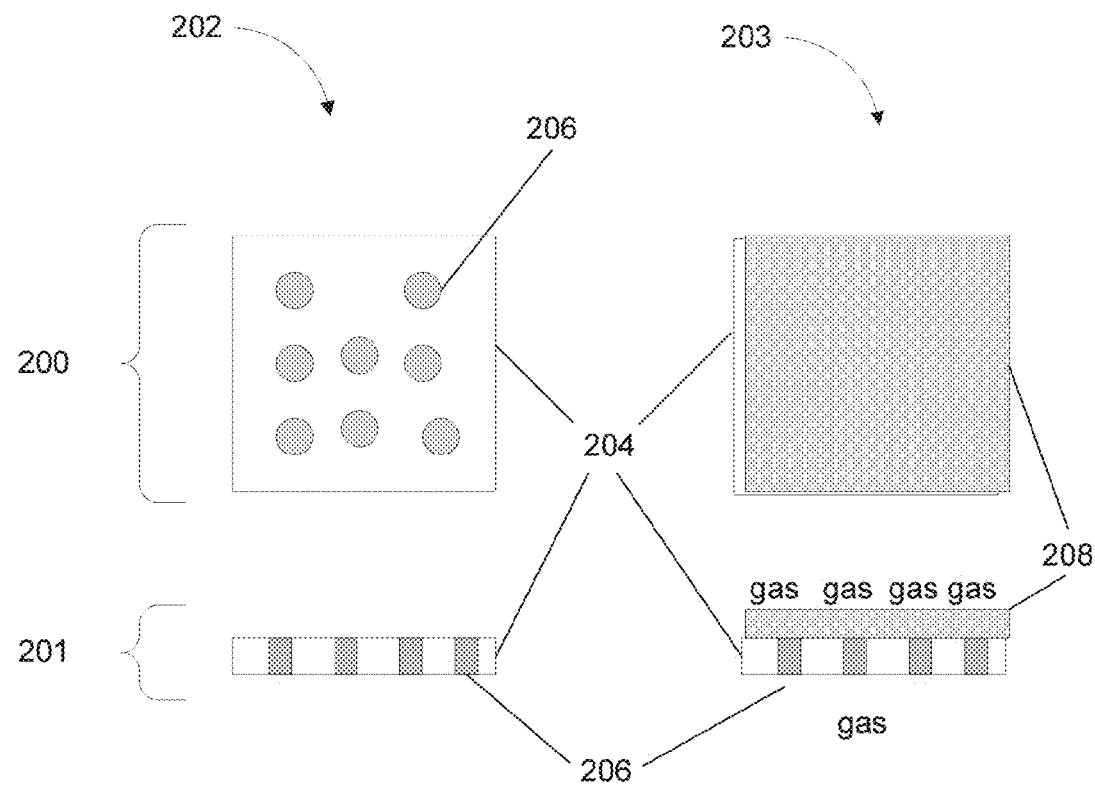
FIGS. 2A-2D are conceptual drawings showing side and top views of various example membranes and components thereof, including gas sorbents in various configurations.

FIG. 2A is a conceptual drawing showing a top view 200 and a side view 201 of an example membrane 203 and components thereof. Membrane 203 may include a perforated graphene layer 202, which may include pores 206 in graphene monolayer 204. Pores 206 may be in the form of any of pores 108, 122, or 128, or a combination thereof. Membrane 203 may also include a gas sorbent layer 208 that contacts a surface of graphene layer 202. As demonstrated in FIG. 2A, gas sorbent layer 208 may be permeable to at least one gas that is able to pass through pores 206 in graphene monolayer 204. Such permeability of gas sorbent layer 208 to the at least one gas may arise from any suitable methods of permeation or combinations thereof according to the material composition of gas sorbent layer 208. In some examples, gas sorbent layer 208 may include a polymer and may exhibit "solution-diffusion" permeation as observed in polymeric gas sorbents. In some additional examples, gas sorbent layer 208 may include a metal layer such as palladium and may exhibit gas-solid permeation such as observed for hydrogen permeation through palladium. In still other examples, gas sorbent layer 208 may include pores, channels, voids, or the like which permit permeation of the at least one gas.

Figure 2B:
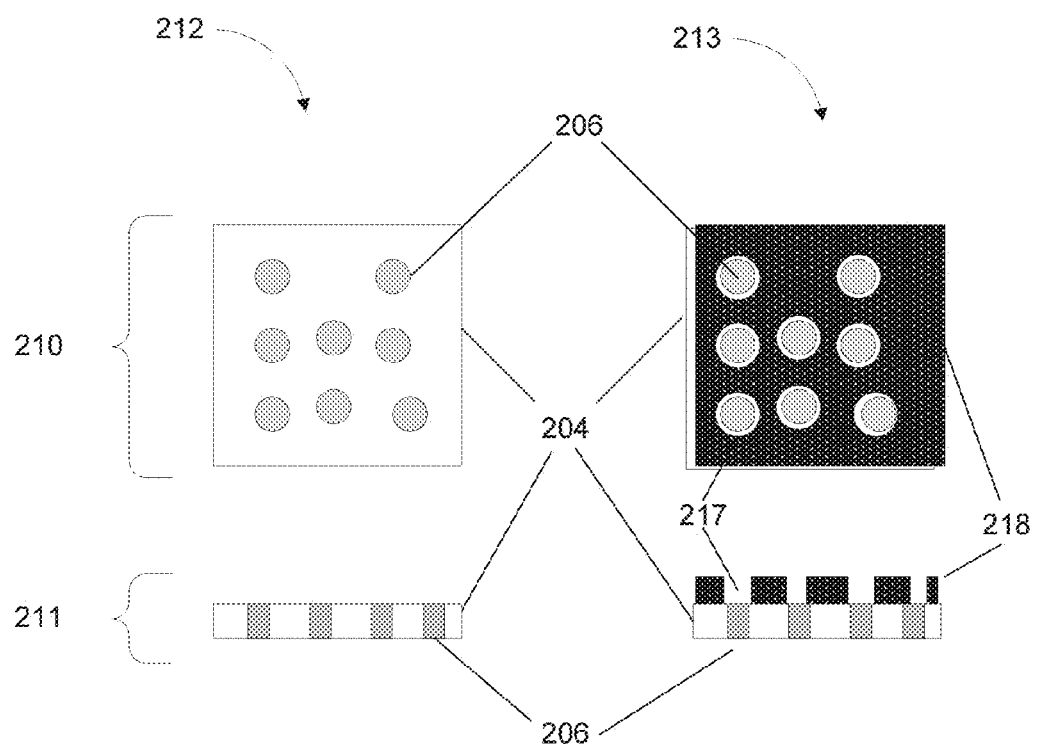

FIG. 2B is a conceptual drawing showing a top view 210 and a side view 211 of a membrane 212 and components thereof. Membrane 212 may include a perforated graphene layer 202, which may include pores 206 in graphene monolayer 204. Membrane 212 may also include a gas sorbent layer 218 that contacts a surface of graphene layer 202. Gas sorbent layer 218 may include a plurality of pores 217. FIG. 2B depicts a situation where gas sorbent 218 may be configured to contact graphene layer 202 substantially between nanoscale pores 206. In various examples, at least a portion of nanoscale pores 206 may be substantially free from obstruction by gas sorbent 218, e.g., at pores 206'/217' gas sorbent 218 does not overlap pore 206'.

Gas sorbent pores 217 may be formed in gas sorbent layer 218 by any suitable method or combination of methods. For example, gas sorbent layer 218 may be combined with a graphene layer 204 prior to formation of pores 206 or 218. In various examples, methods which form pores 206 in graphene layer 204 may also form pores 217 in gas sorbent layer 218 at about the same time as pores 206. In some examples, gas sorbent layer 218 at perforated graphene layer 202 may be chemically etched via existing graphene pores 206 to result in gas sorbent pores 217. For example, a chemical mixture which etches gas sorbent layer 218 may be contacted to graphene layer 202 opposite gas sorbent layer 218, and gas sorbent layer 218 may be chemically etched through graphene pores 206 to form gas sorbent pores 217. In other examples, methods of depositing gas sorbent layer 218 on perforated graphene layer 202 may result in pores 217. For example, methods of depositing the material of gas sorbent layer 218 such as atomic deposition or chemical vapor deposition may deposit gas sorbent 218 at graphene 202 substantially between graphene pores 206, thereby forming gas sorbent pores 217. In some examples, such deposition of gas sorbent 218 may not bridge graphene pores 206, whereby at least a portion of pores 206 may be substantially free from obstruction by gas sorbent 218.

Figure 2C:
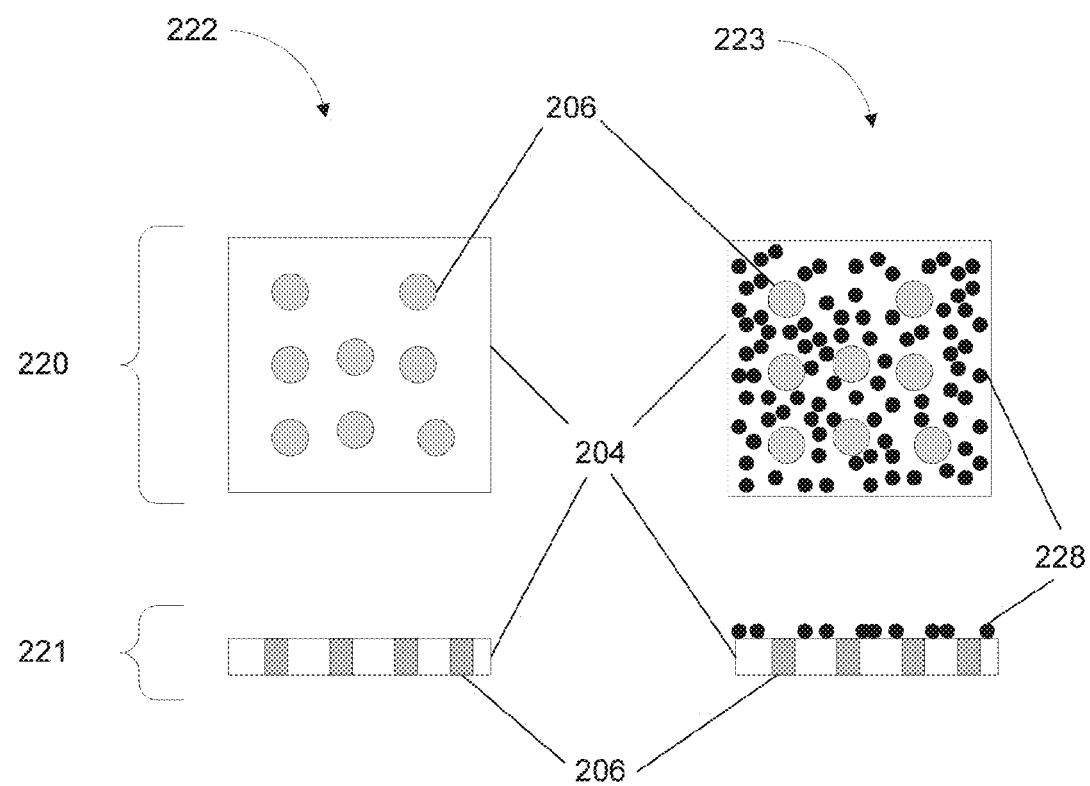
Figure 2D:
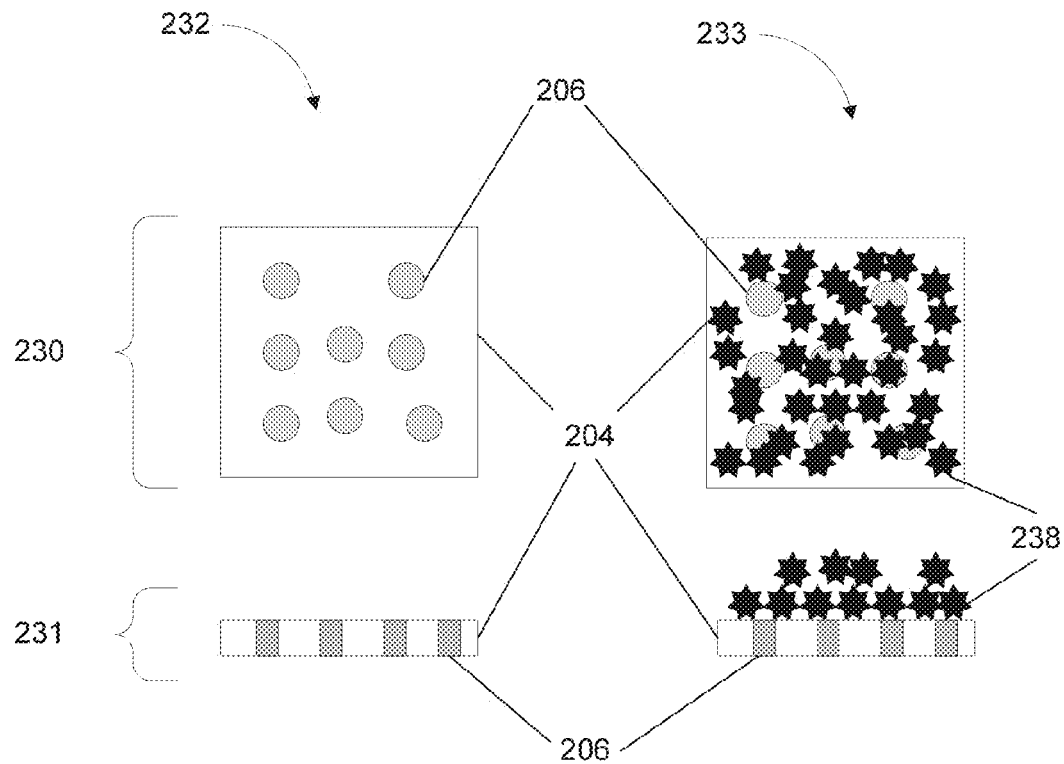

FIG. 2C is a conceptual drawing showing a top view 220 and a side view 221 of a membrane 222 and components thereof. Membrane 222 may include a perforated graphene layer 202, which may include pores 206 in graphene monolayer 204. Membrane 222 may also include gas sorbent particles 228 that contact a surface of graphene layer 202. Gas sorbent particles 228 may contact perforated graphene layer 202 at graphene monolayer 204 between pores 206. Gas sorbent particles 228 may be in the form of microparticles or nanoparticles. In some examples, gas sorbent particles 228 may be in the form of porous microparticles. In some examples, gas sorbent particles 228 may be in the form of nanoparticles. In various examples, as depicted in FIG. 2C, gas sorbent particles 228 do not overlap pores 206 in graphene layer 204. In other examples, gas sorbent particles may overlap pores in the graphene layer as depicted in FIG. 2D and described herein below. In various examples, as depicted in FIG. 2C, gas sorbent particles 228 may form a single layer at graphene layer 204.

Gas sorbent layer 228 may be formed by any suitable method or combination of methods. For example, some methods of depositing the material of gas sorbent layer 228 may include atomic vapor deposition, atomic layer deposition, or chemical vapor deposition, which may deposit gas sorbent 228 at graphene 202 substantially between graphene pores 206. In some other examples, gas sorbent layer 228 may be deposited from a colloidal suspension of corresponding nanoparticles via electrodeposition, solution precipitation, dip coating, spin coating, or the like. In various examples, such deposition of gas sorbent 228 may leave at least a portion of graphene pores 206 substantially free from obstruction by gas sorbent 218.

As used herein, "nanoparticles" may range in size from about 1 atom to about 1000 nanometers in diameter. In some examples, nanoparticles may be a particle or an atomic cluster that includes at least about 2, 3, 4, 5, 10, 15, 20, 25, 50, 75, or 100 atoms. In some other examples, nanoparticles may range in average diameter from: about 1 nanometer to about 500 nanometers; about 1 nanometer to about 250 nanometers; about 1 nanometer to about 100 nanometers; or about 20 nanometers to about 100 nanometers. In various examples, nanoparticles may be nonporous, solid particles. In still additional examples, nanoparticles may include two or more concentric layers of different materials, e.g., as core-shell nanoparticles. For example, palladium shell-silica core nanoparticles may be employed, which may provide the same surface area as solid palladium nanoparticles of the same size, but using less palladium.

As used herein, "microparticles" may range in size from about 1 atom to about 1000 micrometers in average diameter. In some examples, microparticles range in average diameter from about 1 micrometer to about 1000 micrometers, or in some examples from about 1 micrometer to about 250 micrometers in average diameter. In some examples, microparticles may be comprised of porous material such as, for example, microparticles of porous activated carbon, porous zeolites, or the like.

FIG. 2D is a conceptual drawing showing a top view 230 and a side view 231 of an example membrane 232 and components thereof. Membrane 232 may include a perforated graphene layer 202, which may include pores 206 in graphene monolayer 204. In some examples, membrane 232 may also include gas sorbent particles 238 that contact a surface of graphene layer 202. Gas sorbent particles 238 may contact perforated graphene layer 202 at any location, for example at graphene monolayer 204 between pores 206, or across pores 206.

Gas sorbent layer 238 may be formed by any suitable method or combination of methods. For example, methods of depositing the material of gas sorbent layer 238 may include atomic vapor deposition, atomic layer deposition, or chemical vapor deposition which may deposit gas sorbent 238 at graphene 202 substantially between graphene pores 206. In other examples, e.g., as shown in FIG. 2D, gas sorbent layer 238 may have been deposited in various layers from a colloidal suspension of corresponding nanoparticles via electrodeposition, solution precipitation, dip coating, spin coating, or the like. In various examples, such deposition of gas sorbent 238 may bridge graphene pores 206, whereby at least a portion of pores 206 may be at least partly occluded by gas sorbent 238. In various examples, gas sorbent 238 may be made from a material which is permeable to the gas to be sorbed, whereby occlusion of the pores does not bar passage of the gas through the pores. For example, palladium layers less than about a micron in thickness not only adsorb hydrogen gas, but are permeable to hydrogen gas. Consequently, partial or total occlusion of pores 206 by gas sorbent particles 238 in the form of palladium nanoparticles may still permit passage of hydrogen through the pores. In various examples, formation of one or more layers of gas sorbent particles 238 at graphene 202 may partly occlude pores 206, but particles 238 may deposit in a porous arrangement of particles which may still permit passage of a gas through layer 238 and pores 206.

As used herein, a "gas sorbent", e.g., gas sorbents 208, 218, 228 and 238, may include any material that may adsorb at least one gas to a greater extent than a graphene surface (e.g., graphene layer 204).

In various examples, suitable material for a "gas sorbent" may include metals such as metallic elements and alloys, composites, compounds or complexes of metallic elements, or the like. Suitable metallic elements may include, e.g., transition metals, post-transition metals, metalloids, or the like. Transition metals may include, for example, Sc, Ti, V, Cr, Mn, Fe, Co, Ni, Cu, Zn, Y, Zr, Nb, Tc, Ru, Rh, Pd, Ag, Cd, Hf, Ta, W, Re, Os, Ir, Pt, Au, Hg, or the like. For example, Pd, palladium, is known to be an adsorber for hydrogen. Transition metals may also include, e.g., lanthanides or actinides, or the like. Post-transition metals may include, for example, Al, Ga, In, Tl, Sn, Pb, Bi, or the like. Metalloids may include, for example, B, Si, Ge, As, Sb, Te, Po, or the like.

In various examples, the gas sorbent may exclude gold nanoparticles. In some examples, the gas sorbent may include palladium, e.g., the gas sorbent may include palladium nanoparticles characterized by an average diameter in a range from about 20 nanometers to about 100 nanometers. Suitable methods of applying metals include electrochemical deposition; dip coating, spin coating, contact printing, or print coating; atomic, chemical, or physical vapor deposition from a suitable precursor; atomic layer deposition from a suitable precursor; or the like. In another example, a method of contacting the graphene with a coating of metallic nanoparticles may be conducted as follows. A palladium nanoparticle precursor solution may be prepared as a 1 millimolar solution in dichloromethane of a palladium complex such as $Pd_2(\mu\text{-}dPhpz)_2(dPhpzH)_2Cl_2].H_2O$. The palladium nanoparticle precursor solution may be contacted to a layer of graphene for about 1 hour at 25° C. The layer of graphene may be removed from the solution and excess solvent may be evaporated under vacuum to form a dry graphene layer that includes the palladium nanoparticle precursor. Subsequently, the dried graphene layer may be placed in a closed tube furnace and heated to 600° C. at a rate of 5° C./minute under a stream of dry, deoxygenated hydrogen. Next, the graphene layer may be cooled in a dry, deoxygenated hydrogen atmosphere to 36° C. The hydrogen may be replaced with pure dry nitrogen and the graphene layer may be cooled to 25° C. The surface of the resulting graphene layer may include a coating of palladium nanoparticles.

In various examples, suitable material for a "gas sorbent" may include compounds or complexes of a metal. For example, compounds including calcium oxide or magnesium oxide may be employed as a gas sorbent, e.g., for carbon dioxide and/or sulfur dioxide. In another example, complexes such as magnesium salen or cobalt salen may be employed as gas sorbents, e.g., for oxygen. Suitable methods of applying compounds or complexes of a metal include electrochemical deposition; chemical deposition, e.g., precipitation; dip coating, spin coating, contact printing, or print coating; atomic or chemical vapor deposition from a suitable precursor; or electrostatic deposition of a nanoparticle powder; or the like.

In various examples, material for a "gas sorbent" may include gas adsorbing zeolites. Zeolites may include natural and synthetic aluminosilicate minerals commonly used as commercial adsorbents. Suitable zeolites may include a porous structure which may accommodate or adsorb a wide variety of species, including gases. Zeolites may include, for example, amicite, analcime, barrerite, bellbergite, bikitaite, boggsite, brewsterite, chabazite, clinoptilolite, cowlesite, dachiardite, edingtonite, epistilbite, erionite, faujasite, ferrierite, garronite, gismondine, gmelinite, gobbinsite, gonnardite, goosecreekite, harmotome, herschelite, heulandite, laumontite, levyne, maricopaite, mazzite, merlinoite, mesolite, montesommaite, mordenite, natrolite, offretite, paranatrolite, paulingite, pentasil, perlialite, phillipsite, pollucite, scolecite, sodium dachiardite, stellerite, stilbite, tetranatrolite, thomsonite, tschernichite, wairakite, wellsite, willhendersonite, yugawaralite, or the like. Suitable methods of applying zeolites as gas sorbents include providing a plurality of zeolite nanoparticles and coating graphene layer 202 using a powder coating or electrostatic coating process, e.g., as employed in laser printing.

In various examples, material for a "gas sorbent" may include a carbonaceous gas adsorbing material, for example, activated carbon, pyrolytic carbon, carbon nanotubes or fragments thereof, carbon fullerenes or fragments thereof, graphene fragments, or the like. Suitable methods of applying carbonaceous materials as gas sorbents may include deposition from suspensions or solutions, or electrostatic coating of nanoparticle powders.

In various examples, a "gas sorbent" may include gas adsorbing silica, silica gel, or the like. Suitable methods of applying silica materials as gas sorbents may include deposition from suspensions or solutions of silicates, or electrostatic coating of nanoparticle powders of silica.

In various examples, material for a "gas sorbent" may include polymers, including permeable organic polymers, for example, one or more of polyethylene, polytetrafluoroethylene, polypropylene, polyester, polyvinyl chloride, polyvinyl acetate, polyvinyl alcohol, polyurethane, polystyrene, polyolefin, polystyrene, polysulfone, polyethersulfone, copolymers thereof, or the like. Suitable methods of applying polymeric materials as gas sorbents may include deposition from colloidal suspensions or solutions, chemical vapor deposition, or electrostatic coating of polymeric nanoparticle powders.

A "gas sorbent" may be in any suitable solid form, for example, an atomic monolayer, an atomic cluster, a particle such as a nanoparticle or microparticle, a solid layer, a porous solid layer, or the like. In various examples, the gas sorbent may include at least one atomic monolayer, e.g., a monolayer of palladium atoms deposited by atomic vapor deposition or atomic layer deposition on a graphene layer such as 202. In various examples, the gas sorbent at the surface of the graphene layer may be in a range between about 1 atom and about 1 micron in thickness. A "gas sorbent" may be in any suitable configuration, e.g., a nonporous solid that is permeable to a gas, for example, layers of palladium in a range between about 1 atom and about 1 micrometer in thickness, where the layers may exhibit permeability to hydrogen. A "gas sorbent" may be configured as a solid that is permeable to a gas, such as a gas permeable polymer. A "gas sorbent" may be configured as a solid or particle that includes micropores or nanopores, for example, microporous or nanoporous zeolites. A "gas sorbent" may be configured as a membrane of gas adsorbing material that includes micropores or nanopores, for example, a polymeric membrane that includes micropores or nanopores.

A gas sorbent "particle" may include particles in a range from about 1 atom to about 1 micrometer in size. A gas sorbent particle may be solid or porous. A gas sorbent particle may include a single element or molecule, or may be a mixture or composite of different elements or molecules. A gas sorbent particle may be of the same composition throughout or may be a layered structure, such as a core-shell nanoparticle. Gas sorbent particles may be configured at the graphene layer as a monolayer of particles, or as layers two or more particles in thickness.

In various examples, a method of forming an example membrane includes configuring the gas sorbent to increase a surface concentration of at least one gas at the graphene layer. Configuring a gas sorbent to increase a surface concentration of at least one gas at the graphene layer may include, e.g., selecting a suitable gas sorbent material, e.g., from among the gas sorbent materials described herein. Configuring a gas sorbent to increase a surface concentration of at least one gas at the graphene layer may also include, e.g., selecting the gas sorbent physical structure, such as porosity, surface area, and/or particulate/layer form. For example, graphene and activated carbon may have similar gas adsorbing characteristics given equal surface area. However, a layer of porous activated carbon or activated carbon nanoparticles may be utilized to provide a greater effective surface area for adsorption at graphene layer 202 than the surface area of graphene layer 202 itself, due to porosity, tortuosity, and related such physical features in the activated carbon. Configuring a gas sorbent to increase a surface concentration of at least one gas at the graphene layer may also include, e.g., configuring whether the gas sorbent occludes the graphene pores or not. For example, since layers of palladium in a range of thickness between about 1 atom and about 1 micrometer thick are highly permeable to hydrogen, palladium may be employed to occlude pores 206, as gas sorbent 208 does in FIG. 2A. In some examples, particles which may be applied to form porous layers, such as gas sorbent 238 in FIG. 2D, may partly occlude pores 206 since gas may still pass between the gas sorbent particles 238. In other examples, layers of gas sorbent such as 218 in FIG. 2B or particles of gas sorbent such as 228 in FIG. 2C may be applied so pores 206 are clear, or are only partly occluded.

As used herein, "graphene" generally means a planar allotrope of carbon characterized by a hexagonal lattice of carbon atoms that may be connected by aromatic carbon-carbon bonds, e.g., as illustrated by graphene 100 in FIG. 1A. As used herein, a graphene "monolayer" generally may be a one-carbon atom thick layer of graphene. In some examples, the graphene monolayer may include some non-aromatic carbons, e.g., some carbons may be passivated with hydrogen and may be bonded to other carbons by nonaromatic single carbon-carbon bonds. As used herein, a "perforated graphene monolayer" generally may refer to a graphene monolayer that may include a plurality of discrete pores through the graphene monolayer. The discrete pores may pass entirely through the graphene monolayer. The discrete pores may permit selective passage of atomic or molecular species from one side of the graphene monolayer to the other side of the graphene monolayer. As used herein, a "chemically perforated" pore in the graphene may be characteristic of preparation by selective removal of one or more carbon atoms from the graphene lattice, for example, the perforation shown between FIGS. 1B and 1C, or the perforation shown between FIGS. 1D and 1E. For example, atomic or molecular species may be reacted with the graphene in a process which results in selective removal of one or more carbon atoms from the graphene lattice. Example procedures for preparing the pores are described further in the discussion of FIGS. 4A-5E.

As used herein, "discrete" pores in a graphene monolayer are distinct from each other by at least one intervening carbon-carbon bond, or in some examples, at least one intervening six-membered graphene ring. For example, in FIG. 1C, discrete pores 108A and 108B are separated by at least four six membered rings or at least five carbon-carbon bonds. Also, for example, in FIG. 1C, discrete pore 108C may be separated from each of discrete pores 108A and 108B by at least three six-membered rings or at least four carbon-carbon bonds. In another example, in FIG. 1E, discrete pores 122A and 122B are separated by at least four six membered rings or at least five carbon-carbon bonds. Also, for example, in FIG. 1E, discrete pore 122C may be separated from each of discrete pores 122A and 122B by at least three six-membered rings or at least four carbon-carbon bonds.

As used herein, pores, e.g., pores 108, 122, 128, 206, and the like, may be nanoscale pores. "Nanoscale pores", in some examples described herein, may be characterized by a maximum diameter in a range from about 0.1 nanometers to about 10 nanometers. In various examples, "nanoscale pores", may be characterized by an average diameter in a range from about 0.1 nanometers to about 10 nanometers, or in some examples, by an average diameter in a range from about 0.1 nanometers to about 4 nanometers.

As used herein, "minimum steric separation" generally may refer to the distance between the centers of adjacent discrete pores, such as distance 104 in FIG. 1C or distance 118 in FIG. 1E. For example, a minimum steric separation corresponding to at least one intervening carbon-carbon bond may be at least about 1 angstrom. In some examples, a minimum steric separation corresponding to at least one intervening six-membered graphene ring may be at least about 2.4 angstroms. In various examples, a minimum steric separation may range from between about 1 angstrom to about 100 angstroms, for example, at least about 1, 2, 3, 4, 5, 6, 7, 8, 9, 10, 12.5, 15, 20, 25, 35, or 50 angstroms. As used herein, "minimum steric separation" may generally refer to twice a minimum steric radius $r_R$ of an R group in a bulky chemical perforation reagent R-Het* employed to make the discrete pores. Methods of chemical perforation using bulky reagents R-Het* and details of R groups and minimum steric radii $r_R$ are generally described further with respect to FIGS. 3A-5E.

In various examples, at least a portion of the pores in the plurality of nanoscale pores are substantially the same size such that the graphene layer has substantially uniform pore sizes throughout.

In various examples, the pores may be characterized by one or more carbon vacancy defects in the graphene monolayer such that the graphene layer has substantially uniform pore sizes throughout. In some examples, each of the pores may be characterized by one or more carbon vacancy defects in the graphene monolayer such that the pores have substantially the same number of carbon vacancy defects throughout.

As used herein, a "carbon vacancy defect" may be a pore in a graphene monolayer which may be defined by the absence of one or more carbon atoms compared to a graphene monolayer without a carbon vacancy defect.

As used herein, a "substantially uniform pore size" means that the discrete pores may be characterized by substantially the same number of one or more carbon vacancy defects per discrete pore. For example, in FIG. 1C, discrete pores 108 may be characterized as single-carbon vacancy defects corresponding to the absence of carbon atoms 102 from graphene monolayer 100 in FIG. 1B. In another example, in FIG. 1E, discrete pores 122 may be characterized as double-carbon vacancy defects corresponding to the absence of carbon atoms 114 and 116 from graphene monolayer 100 in FIG. 1D. In various examples, discrete pores of substantially uniform pore size may have their carbon vacancy defects arranged in substantially the same relative lattice positions within each discrete pore. For example, a plurality of substantially uniform pores that include six carbon vacancy defects each may correspond to removal of a six membered ring of carbon atoms in the hexagonal graphene lattice. In another example, a plurality of substantially uniform pores that include six carbon vacancy defects each may correspond to removal of a six membered staggered linear chain of carbon atoms in the hexagonal graphene lattice.

As used herein, "substantially uniform pore sizes throughout" means that at least about 80% of the discrete pores in a perforated graphene monolayer may have a substantially uniform pore size. In various examples, the percentage of discrete pores in a perforated graphene monolayer that may have a substantially uniform pore size may be: about 85%, about 90%, about 95%, about 96%, about 97%, about 98%, about 99%, about 99.5%, or about 99.9%. In some examples, all of the discrete pores in a perforated graphene monolayer may have a substantially uniform pore size.

As used herein, "substantially the same number of one or more carbon vacancy defects" in relation to the plurality of discrete pores means that such discrete pores differ from each other by at most about three carbon vacancy defects. For example, a plurality of pores having substantially the same number of one or more carbon vacancy defects may range between one and three carbon vacancy defects per pore. In various examples, discrete pores may vary in number of carbon vacancy defects by about three, about two, or about one. In some examples, each of the plurality of discrete pores has the same number of carbon vacancy defects. For example, in FIG. 1C, discrete pores 108 may be characterized as having a single carbon vacancy defect per pore. In another example, in FIG. 1E, discrete pores 122 may be characterized as having a two-carbon vacancy defect per pore. In other examples, at least about 80% of the discrete pores in a perforated graphene monolayer may the same number of carbon vacancy defects. In various examples, the percentage of discrete pores in a perforated graphene monolayer that may have the same number of carbon vacancy defects may be: about 85%, about 90%, about 95%, about 96%, about 97%, about 98%, about 99%, about 99.5%, or about 99.9%. In some examples, all of the discrete pores in a perforated graphene monolayer may have the same number of carbon vacancy defects.

As used herein, the "number" of carbon vacancy defects in reference to "substantially the same number of one or more carbon vacancy defects" means about one or more carbon defects, or in some examples about two or more carbon defects. In various examples, the number of carbon vacancy defects may be between about one and about ten defects, for example, about: one, two, three, four, five, six, seven, eight, nine, or ten defects.

Figure 3A:
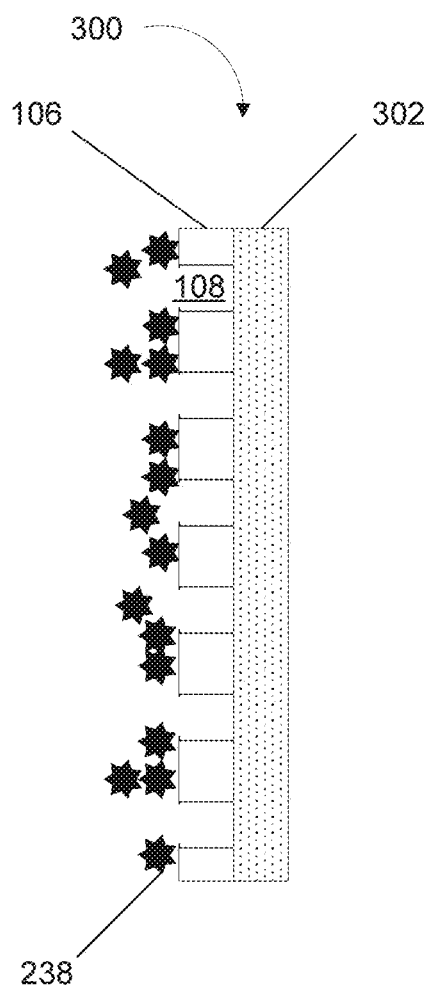
FIG. 3A is a conceptual drawing of a side view of an example membrane in contact with a permeable substrate.

FIG. 3A is a conceptual drawing of a side view of an example membrane 300 that includes a perforated graphene monolayer 106 configured in contact with a permeable substrate 302. Perforated graphene monolayer 106 may include discrete pores 108. A gas sorbent such as nanoparticle gas sorbent 238 is configured within proximity to perforated graphene monolayer 106. A substrate such as permeable substrate 302 may be configured to contact one or both sides of an example perforated graphene monolayer such as 106. Permeable substrate 302 may provide physical support for a porous graphene layer such as 106. Nanoparticle gas sorbent 238 may partly occlude pores 108 as shown in FIG. 3A.

As used herein, a "permeable substrate", for example permeable substrate 302, may be any material that may be employed to provide support to a perforated graphene monolayer such as 106. As used herein, a "permeable substrate" may also be permeable to at least one atomic or molecular species that traverses the discrete pores in the perforated graphene monolayer. Suitable permeable substrates may include "solution-diffusion" solid membranes that permit atomic or molecular species to diffuse through the solid material of the permeable substrate. Suitable permeable substrates may also be configured as porous membranes or filters having pores, voids, channels, or the like, through which atomic or molecular species may travel. Suitable materials for the permeable substrate may include, for example, one or more of polyethylene including ultra high molecular weight polyethylene, polypropylene, polyester, polyurethane, polystyrene, polyolefin, aramide, aromatic polyester, carbon fiber, polysulfone and/or polyethersulfone. Suitable permeable substrates may also include metal meshes and porous ceramics. In various examples, suitable polymeric materials for the permeable substrate may be nanoporous supports characterized by a minimum molecular weight cutoff from: about 1,000,000 daltons; about 500,000 daltons; about 250,000 daltons; or about 100,000 daltons. In some examples, a suitable permeable substrate may include a polyether sulfone membrane characterized by a molecular weight cutoff of about 100,000 daltons. In some examples, suitable permeable substrates may be constructed from materials, such as polymeric gas sorbents, which exhibit gas sorbent properties. In some examples, such gas-sorbing permeable substrates may act both to support a porous graphene layer such as 106 and to adsorb at least one gas. In various examples, such gas adsorbing permeable substrates may be employed as the only gas sorbent. In some examples, such gas adsorbing permeable substrates may be employed in addition to another gas sorbent such as nanoparticle gas sorbent 238.

Figure 3B:
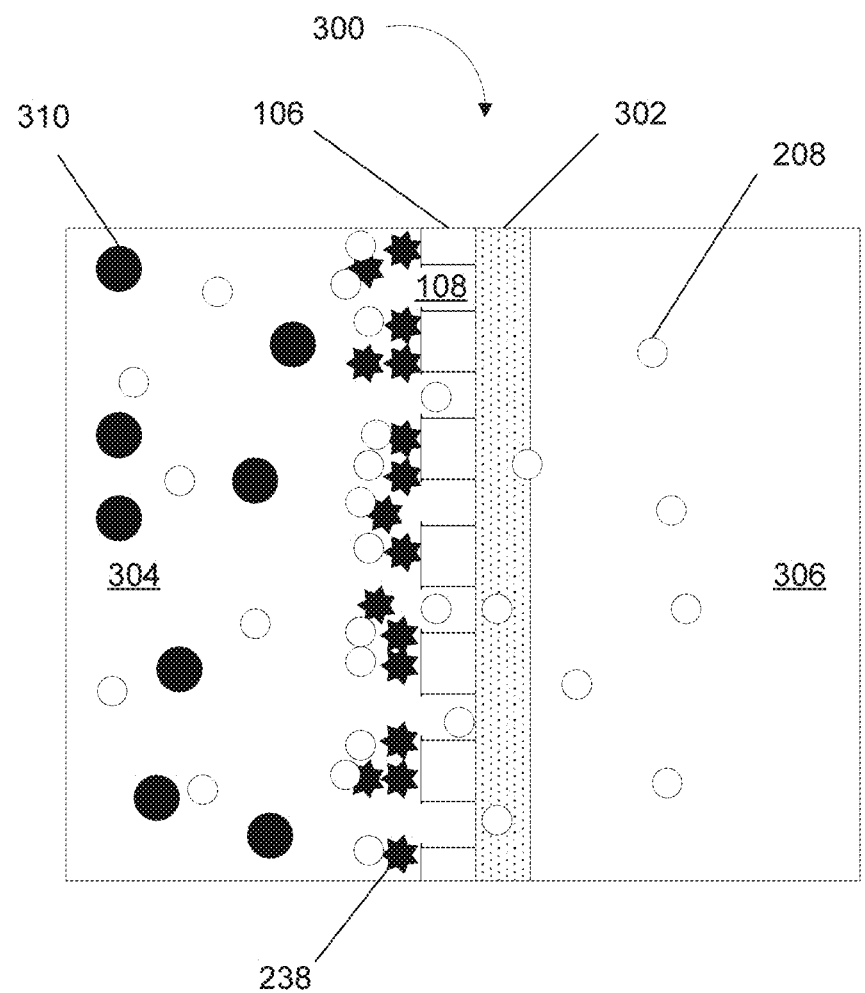
FIG. 3B is a conceptual drawing of a side view of an example membrane in contact with a permeable substrate and a gas sorbent, illustrating adsorption and separation of a first gas molecule.

FIG. 3B is a conceptual drawing of a side view of an example membrane 300 that may include a perforated graphene monolayer 106 arranged in contact with a permeable substrate 302. Perforated graphene monolayer 106 may include discrete pores 108. A gas sorbent such as nanoparticle gas sorbent 238 is configured at perforated graphene monolayer 106. A substrate such as permeable substrate 302 may be configured to contact one or both sides of an example perforated graphene monolayer such as 106. Permeable substrate 302 may provide physical support for a porous graphene layer such as 106. Nanoparticle gas sorbent 238 may partly occlude pores 108 as shown in FIG. 3A. In FIG. 3B, example membrane 300 separates a chamber 304 and a chamber 306. Chamber 304 may be configured to contain a fluid mixture of two molecules 308 and 310. Chamber 306 may be configured for receiving a purified selection of one of molecules 308 and 310. FIG. 3B depicts the fluid mixture, including first gas molecule 308, symbolized by white-filled circles, and second molecule 310, symbolized by black-filled circles. The fluid mixture of molecules 308 and 310 may be contacted to membrane 300. First gas molecule 308 may be directed from chamber 304 through pores 108 to chamber 306 to separate first gas molecule 308 from second molecule 310. In various examples, first gas molecule 308 may be directed through discrete pores 108 by employing a processing gradient across the graphene monolayer. The processing gradient may include differences in one or more properties such as temperature, pressure, gas concentration, or electric field.

As shown in FIG. 3B, first gas molecule 308 adsorbs at gas sorbent 238. In various examples, gas sorbent 238 may act to increase the effective surface concentration of first gas molecule 308 at porous graphene layer 106, e.g., increasing the number of first gas molecules 308 within about 1 micrometer of porous graphene layer 106. For example, gas transport of any particular gas molecule through a membrane that lacks a gas sorbent such as 238 may depend on the gas molecule being sufficiently aligned with a pore in terms of molecular orientation, momentum, direction of travel, etc. In various examples, gas sorbent 238 may act to at least partly constrain the motion of adsorbed gas molecules 308 to the surface of gas sorbent 238, which may increase the probability of gas molecules 308 entering pores such as 108. In various examples, a membrane such as 300 may exhibit increased transport rates for gas molecules 308 compared to an otherwise identical membrane without a gas sorbent such as 238.

In various examples, a method of separating a gas from a fluid mixture may include providing a fluid mixture that includes a first gas and a second gas, wherein a molecule of the second gas is larger than a molecule of the first gas. The first and second molecules may also include one or more differences in atomic or chemical character such as differences in elemental composition, isotopic composition, molecular structure, size, mass, hydrophobicity, polarity, polarizability, charge distribution, or the like. For example, the first gas molecule 308 may be smaller than the second molecule 310 as symbolized by the relative sizes of the filled circles in FIG. 3B. In some examples, discrete pores such as 108 may be characterized by a diameter that may be selective for passage of the first gas molecule compared to the second molecule. The diameter may select for passage of first gas molecule 308 compared to second molecule 310 based on the one or more differences in atomic or chemical character, e.g., size. First gas molecule 308 may be one of helium, neon, argon, xenon, krypton, radon, hydrogen, nitrogen, oxygen, carbon monoxide, carbon dioxide, sulfur dioxide, hydrogen sulfide, a nitrogen oxide, a C1-C4 alkane, a silane, water, or a haloacid.

As used herein, a "fluid mixture" may be any fluid phase, e.g., gas phase, liquid phase, or supercritical phase, which may include at least a first molecular species and a second molecular species, e.g., molecules 308 and 310, wherein at least first molecule 308 is a gas molecule. In various examples, the fluid mixture may include: a mixture of gases; a mixture of vapor and gas; a mixture of liquids; a solution of a gas dissolved in a liquid; a solution of a solid dissolved in a liquid; a solution of a gas, liquid or solid in a supercritical fluid; or the like. In some examples, the fluid mixture may be in contact with other phases of the two or more different molecules. For example, a fluid mixture that includes fluid phase carbon dioxide as one of the molecules may be in contact with solid phase carbon dioxide.

As used herein, "separation selectivity" means a ratio of perforated graphene monolayer permeability rates between specific pairs of atomic or molecular species, for example, molecules 308 and 310 in FIG. 3B. For example, theoretical calculations have been described for a one-atom thick monolayer characterized by pores about 2.5 angstroms in diameter; the ratio of a calculated hydrogen permeability rate divided by a calculated methane permeability rate was $10^{23}$:1. In comparison, currently known "solution diffusion" polymer membranes have a hydrogen to methane separation selectivity of about 150:1. Perforated graphene monolayers described herein may be characterized by a separation selectivity, for example, perforated graphene monolayers 106 in FIG. 1C, 120 in FIG. 1E, and 106 in membrane 300 in FIG. 3A and FIG. 3B. For example, an example perforated graphene monolayer such as 106 may include about one carbon vacancy defect per pore. A hydrogen/methane separation selectivity for perforated graphene monolayer 106 may be characterized as the ratio of permeation rates of molecular hydrogen ($H_2$) compared to methane ($CH_4$). In some examples, the hydrogen/methane separation selectivity may be at least about 200:1; or in various examples, between about 200:1 and about $10^{23}$:1, for example, at least about: $10^3$:1; $10^4$:1; $10^5$:1; $10^6$:1; $10^9$:1; $10^{12}$:1; $10^{15}$:1; $10^{18}$:1; or $10^{21}$:1.

In various examples, a method of forming an example membrane includes providing a graphene layer perforated by a plurality of nanoscale pores, e.g., membranes 106, 120, 126 and 204 and pores 108, 122, 128, and 106. In various examples, such nanoscale pores may be formed by chemical methods, as depicted in FIGS. 4A-4C and 5A-5E.

Figure 4A:
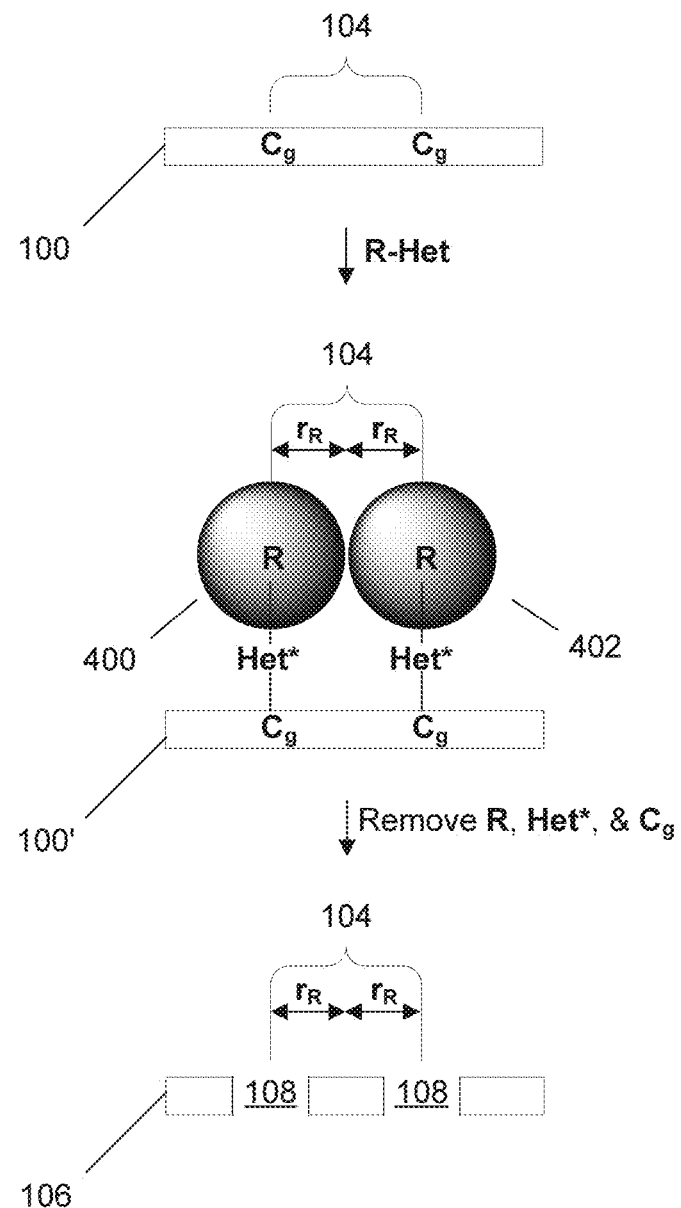
FIG. 4A is a conceptual drawing showing a method of forming a plurality of discrete pores in a graphene monolayer, including steric interactions between adjacent reagents.

FIG. 4A is a conceptual drawing showing a method of forming a plurality of discrete pores 108 in a graphene monolayer 100 to form perforated graphene monolayer 106. FIG. 4A shows a side view of graphene monolayer 100. A reagent R-Het* may be contacted to a plurality of locations at a graphene monolayer such as graphene monolayer 100. The reagent may be contacted to the graphene monolayer in any suitable form, such as a solid, a liquid, a gas, a solute in a solution, particles in a suspension, or the like. The reagent may be contacted to the graphene monolayer by any suitable means, such as by immersion; spin coating; dip coating; selective coating, e.g., applied via an ink jet-type nozzle; sublimation or condensation; chemical vapor deposition; or the like.

FIG. 4A also shows that at graphene monolayer 100, the reagent represented by R-Het* may be reacted with at least one graphene carbon atom $C_g$ at each of the plurality of locations, e.g., $C_g$ 404 and 406. The reaction forms heteroatom-carbon moieties represented by R-Het-$C_g$ 400 and 402 in modified graphene monolayer 100'. Modified graphene monolayer 100' may be represented by the formula [R-Het-$C_g$]$_p$graphene, where p represents the number of locations in the plurality of locations.

FIG. 4A also shows that at graphene monolayer 100', steric interactions between adjacently located R-Het-$C_g$ 400 and 402 provide a minimum separation distance 104. The side view shown in FIG. 4A may be compared to the top view shown in FIGS. 1B and 1C. The R groups, symbolized by the shaded spheres in FIG. 4A, may be selected to provide a minimum steric radius $r_R$. The phrase "minimum steric radius $r_R$" means the relative orientation of respective R groups that provides minimum separation distance 104 of at least about 2*$r_R$. The shaded spheres representing the R groups in FIG. 4A correspond to circles 105 and 119 shown in FIGS. 1B, 1C, 1D and 1E. The minimum steric distance 104 provided by using the R groups may substantially reduce the chance of R-Het-$C_g$ derivatizing adjacent carbon-carbon bonds in graphene. In various examples, the steric interactions may isolate Het-$C_g$ bonds from each other. In various examples, the steric interactions may lead to discrete pore formation, where graphene carbon radicals created by removing Het-$C_g$ may be unlikely to combine into larger pores.

The group represented by R may be one of —$R^a$, —$SO_2R^a$, —(CO)O$R^a$, or —Si$R^aR^bR^c$; where $R^a$, $R^b$, and $R^c$ are each independently alkyl, aryl, heteroaryl, aralkyl, or heteroaralkyl. In various examples, the alkyl, aryl, heteroaryl, aralkyl, and heteroaralkyl groups represented by $R^a$, $R^b$, and $R^c$ may be substituted or unsubstituted. In some examples, the groups represented by $R^a$, $R^b$, and $R^c$ may be unsubstituted.

The group Het* may be any heteroatom group which reacts with carbons $C_g$ or carbon-carbon double bonds $C_g$=$C_g$ in graphene to form heteroatom-carbon moieties, e.g., as represented by R-Het-$C_g$ 400 and 402. Examples of heteroatom groups represented by Het* may include nitrene radical, or an activated oxy group such as oxy radical, oxy anion, hydroxyl, carboxyl, or carboxylate; or the like. Activated heteroatom reagents represented by R-Het* may be prepared by activating precursor compounds represented by R-Het. Various examples of reacting heteroatom groups with graphene are discussed in the descriptions of FIGS. 5A, 5B, 5C, 5D, and 5E.

FIG. 4A also shows that perforated graphene monolayer 106, including discrete pores 108, may be formed by removing heteroatom-carbon moieties represented by R-Het-$C_g$ 400 and 402 at modified graphene monolayer 100'. Discrete pores 108 are characterized by carbon vacancy defects in the graphene monolayer defined by removing the graphene carbon atoms $C_g$ from the plurality of locations such that the graphene monolayer has substantially uniform pore sizes throughout.

Figure 4B:
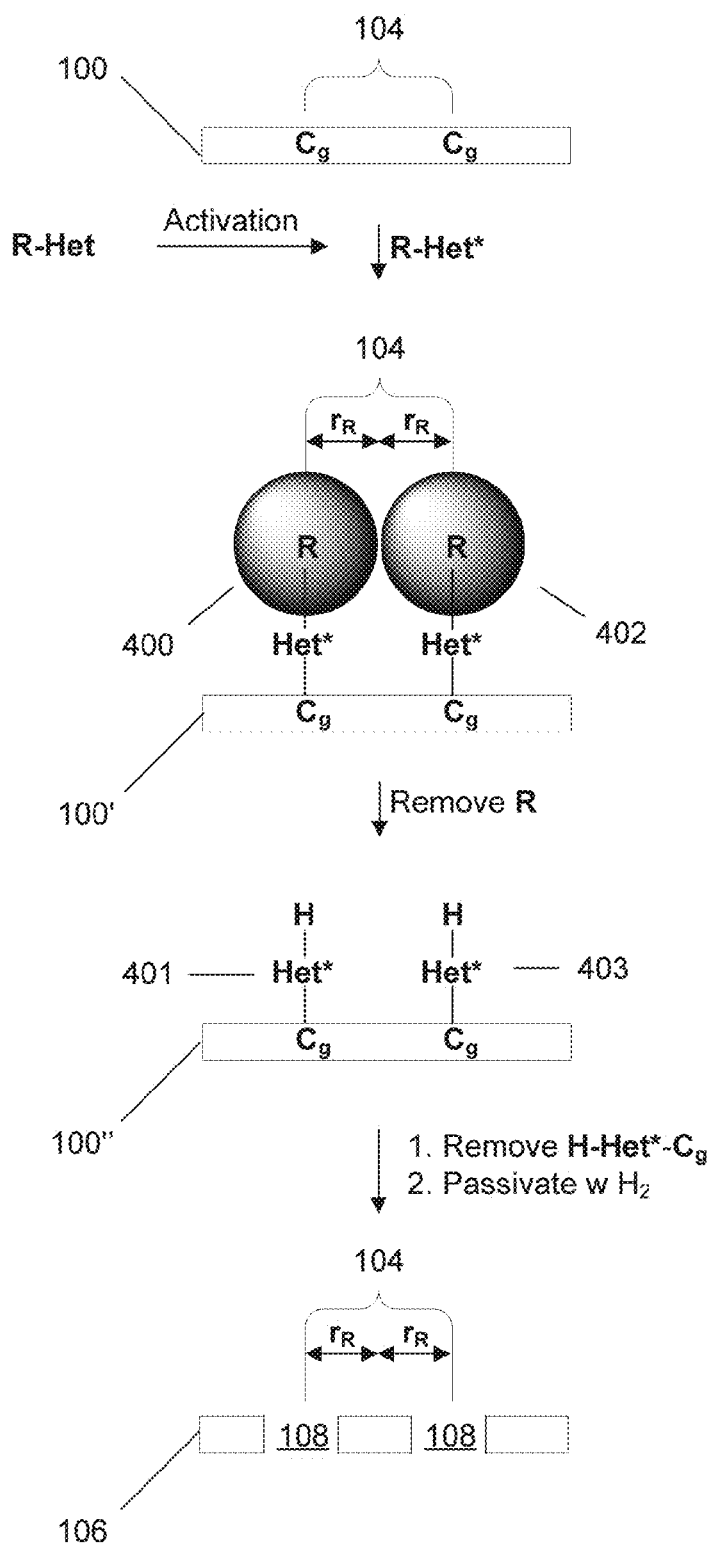
FIG. 4B is a conceptual drawing showing additional operations which may be included in a method of forming a plurality of discrete pores in a graphene monolayer.

FIG. 4B is a conceptual drawing showing additional operations which may be included in a method of forming a plurality of discrete pores 108 in a graphene monolayer 100 to form perforated graphene monolayer 106. For example, FIG. 4B shows an operation of activating a precursor R-Het to form the activated reagent R-Het*. In another example of an additional operation, FIG. 4B shows that the heteroatom-carbon moieties represented by R-Het-$C_g$ 400 and 402 may be removed by employing additional operations. For example, as shown in FIG. 4A, the R groups may be removed to provide groups H-Het*-$C_g$ 401 and 403, followed by removal of H-Het*-Cg 401 and 403 and passivation with hydrogen to provide discrete pores 108 in perforated graphene monolayer 106.

Figure 4C:
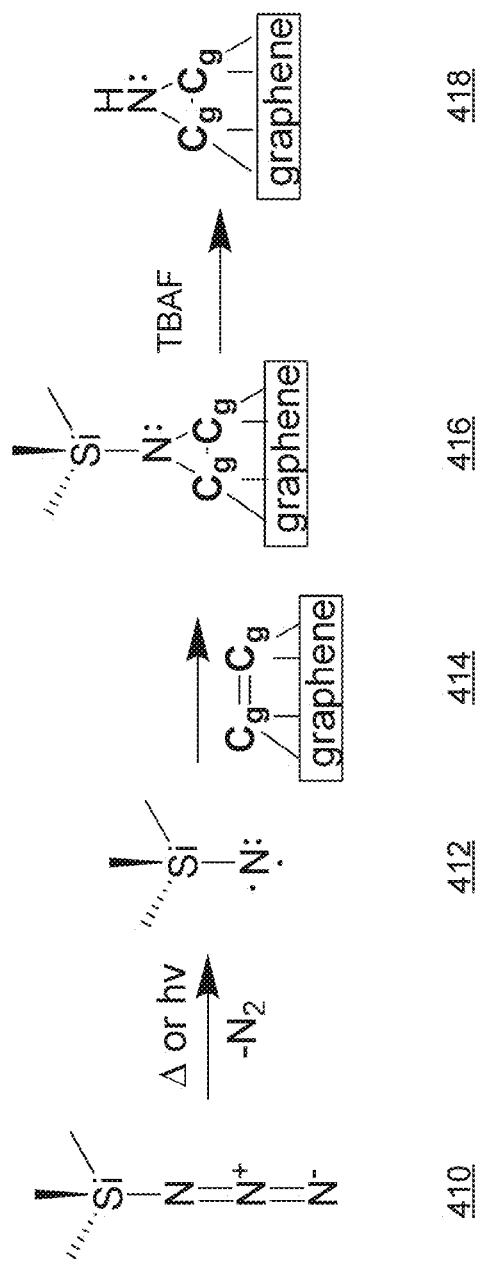
FIG. 4C depicts an example reaction scheme corresponding to the general scheme shown in FIG. 4A and FIG. 4B.

FIG. 4C depicts an example reaction scheme corresponding to the general scheme shown in FIG. 4A and FIG. 4B. In FIG. 4C, trimethyl silyl azide 410, corresponding to R-Het in FIGS. 4A and 4B, may be first heated or photolyzed to produce the activated trimethyl silyl nitrene radical 412. For example, graphene 414 may be placed in an evacuated reaction chamber. Trimethyl silyl azide 410 may be degassed and evaporated to a pressure between about 0.1 Torr and about 10 Torr, for example about 1 Torr. The chamber may be heated, for example, between about 150° C. and about 250° C., for example, about 200° C. Trimethyl silyl nitrene radical 412 may be reacted with a carbon carbon double bond in graphene 414 to form the trimethyl silyl aziridine compound 416, corresponding to R-Het-$C_g$ in FIGS. 4A and 4B. Referring to FIG. 4A, the Het group in R-Het-$C_g$ 400 and 402 bonds to at least one carbon $C_g$. In the example shown in FIG. 4C, the nitrene radical bonds to two carbons to form the three-membered aziridine ring in compound 416. The specific example in FIG. 4C also shows that the trimethyl silyl group in compound 416, corresponding to R, may be cleaved, e.g., with a fluoride ion source such as tetrabutyl ammonium fluoride to form the N—H aziridine ring in compound 418.

Figure 5A:
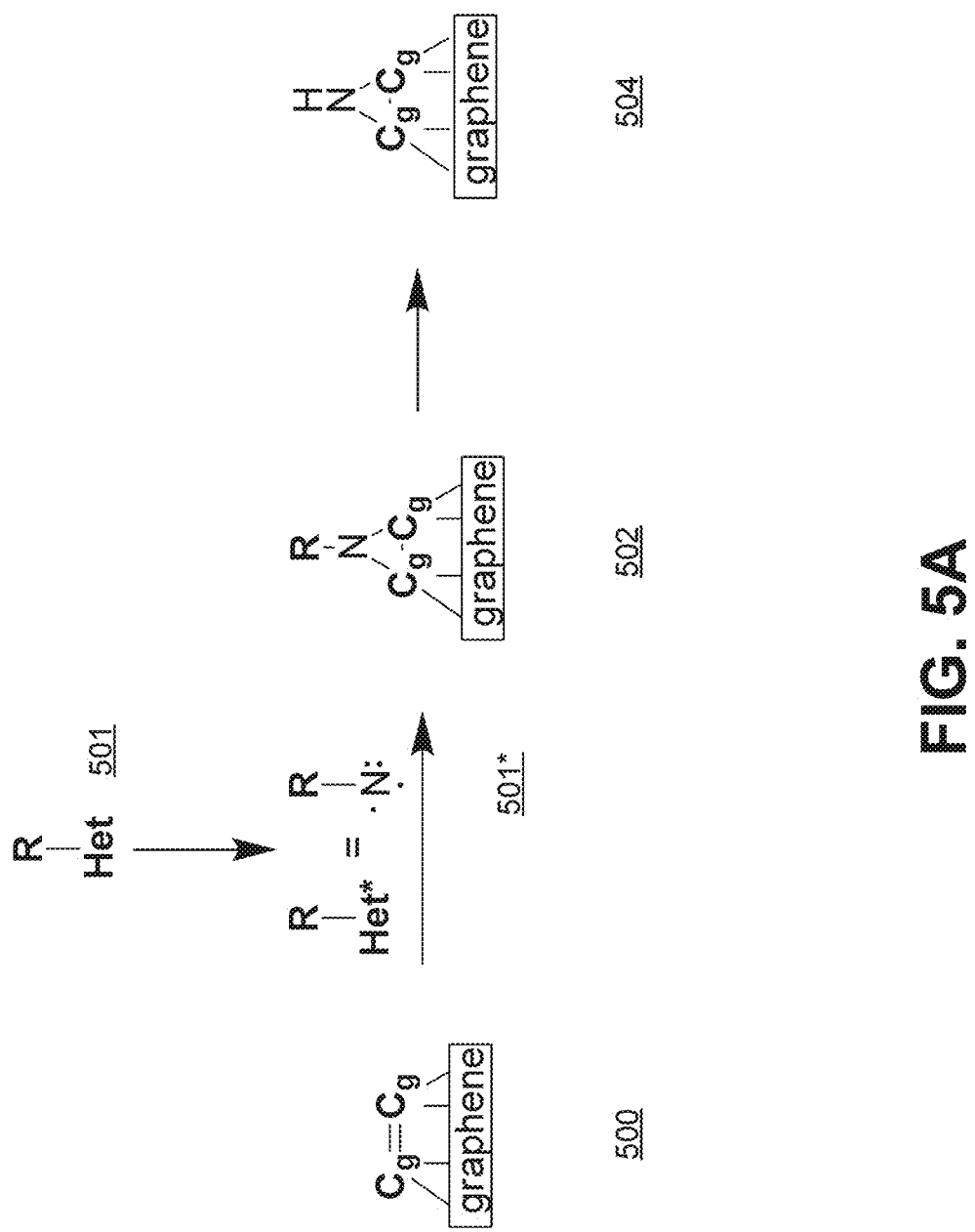
FIG. 5A depicts an example reaction scheme where an example graphene monolayer may be contacted with a plurality of substituted nitrene radicals.

FIG. 5A depicts an example reaction scheme corresponding to a portion of the general scheme shown in FIG. 4A and FIG. 4B. Graphene monolayer 500 may be contacted with a plurality of substituted nitrene radicals 501. A plurality of carbon-carbon double bonds $C_g=C_g$ in graphene monolayer 500 may react with the substituted nitrene radicals 501. A graphene monolayer may be formed that may be functionalized with a plurality of N—R substituted aziridine groups as represented by aziridine structure 502. The N—R substituents of the aziridine groups may be cleaved to form an N—H aziridine structure 504.

In various examples, a suitable nitrene precursor group represented by -Het may be azide, $—N_3$. In some examples, R-Het* may be prepared as R-nitrene 501 by reacting an azide precursor represented by $R—N_3$ under thermolytic or photolytic conditions suitable for converting azide to nitrene. In some examples, suitable values for R when -Het is azide may include $—R^a$ or $—SiR^aR^bR^c$. In various examples, reaction of R-nitrene with graphene produces an N—R aziridine 502 as shown in FIG. 5A.

In some examples, R in aziridine structure 502 may be $—SiR^aR^bR^c$. In various examples, groups such as $—SiR^aR^bR^c$ may be cleaved from the substituted aziridine represented by structure 502 by contacting each substituted aziridine 502 with one of: a quaternary ammonium fluoride; an alkyl sulfonic acid; an aryl sulfonic acid; trifluoromethane sulfonic acid; an alkali metal hydroxide; or an oxidant.

In various examples, when R may be $—(CO)OR^a$, a suitable nitrene precursor group represented by -Het may be $—N—OSO_2—R^f$, wherein $R^f$ may be a methanesulfonate, trifluoromethanesulfonate, bromophenylsulfonate, methylphenylsulfonate or nitrophenylsulfonate group. In some examples, R-Het* may be prepared as R-nitrene 501 by reacting a nitrene precursor represented by $R^aO(CO)—N—OSO_2—R^f$ with an amine base such as triethylamine. In various examples, reaction of R-nitrene with graphene produces an N—R aziridine 502 as shown in FIG. 5A.

In various examples, when R may be $—(SO_2)R^{a'}$, a suitable nitrene precursor group represented by -Het may be $—NH_2$. In some examples, $R^{a'}$ may be substituted or unsubstituted alkyl, aryl, heteroaryl, aralkyl, or heteroaralkyl. In various examples, $R^{a'}$ may be an alkyl, fluoroalkyl, bromophenyl, alkylphenyl or nitrophenyl group, which may be further substituted. In some examples, R-Het* may be prepared as R-nitrene 501 by reacting a nitrene precursor represented by $R^a—SO_2—NH_2$ with $PhI(O(CO)CH_3)_2$ in the presence of a copper, palladium, or gold catalyst. Example catalysts may include copper acetylacetonate, palladium tetrakis acetylacetonate, gold 4,4',4"-tri-tert-butyl-2,2':6',2"-terpyridine triflate, or the like. The reaction may be conducted in situ with a graphene monolayer. In some examples, $R^a—SO_2—NH_2$ may be reacted with $PhI(O(CO)CH_3)_2$ with an alkaline metal hydroxide, e.g., KOH, in an alcohol, e.g. methanol, to form $R^a—SO_2—N=IPh$. The isolated $R^a—SO_2—N=IPh$ may be then be reacted with a copper, palladium, or gold catalyst such as copper acetylacetonate to produce R-Het* as R-nitrene. In various examples, reaction of R-nitrene with graphene produces an N—R aziridine 502 as shown in FIG. 5A.

In some examples, R in aziridine structure 502 may be $—(CO)OR^a$. In various examples, groups such as $—(CO)OR^a$ may be cleaved from the substituted aziridine represented by structure 502 by contacting each substituted aziridine 502 with one of: an alkali alkylthiolate; a trialkyl silyl iodide; an alkali metal hydroxide; an alkali earth metal hydroxide; potassium carbonate; HBr/acetic acid; sodium bis(2-methoxyethoxy)aluminum hydride; sodium tellurium hydride; a potassium trialkylsiloxide; an alkyl lithium; a quaternary ammonium fluoride; an acyl chloride with sodium iodide; an alkyl sulfonic acid; trifluoromethane sulfonic acid; or an aryl sulfonic acid.

In some examples, R in aziridine structure 502 may be $—SO_2R^a$. In various examples, groups such as $—SO_2R^a$ may be cleaved from the substituted aziridine represented by structure 502 by contacting each substituted aziridine 502 with one of: HBr and acetic acid; HBr and phenol; HF and pyridine; sodium bis(2-methoxyethoxy)aluminum hydride; an alkali metal arylide salt; an alkali metal in ammonia or iso-propylamine; sodium-potassium alloy adsorbed on silica gel; samarium iodide; perchloric acid in acetic acid; photolysis in the presence of ether; photolysis in the presence of sodium borohydride and dimethoxybenzene; photolysis in the presence of hydrazine; photolysis in the presence of borane:ammonia; photolysis in the presence of sodium borohydride and beta-naphthoxide; or sodium amalgam in the presence of sodium monohydrogen phosphate.

In some examples, R in aziridine structure 502 may be $—R^a$. In various examples, groups such as $—R^a$ may be cleaved from the substituted aziridine represented by structure 502 by contacting each substituted aziridine 502 with one of: hydrogen in the presence of catalytic palladium; borane in the presence of catalytic palladium; borane in the presence of catalytic Raney nickel; or hydrogen peroxide followed by tetrasodium 5,10,15,20-tetra(4-sulfophenyl)porphyrinatoiron(II).

Figure 5B:
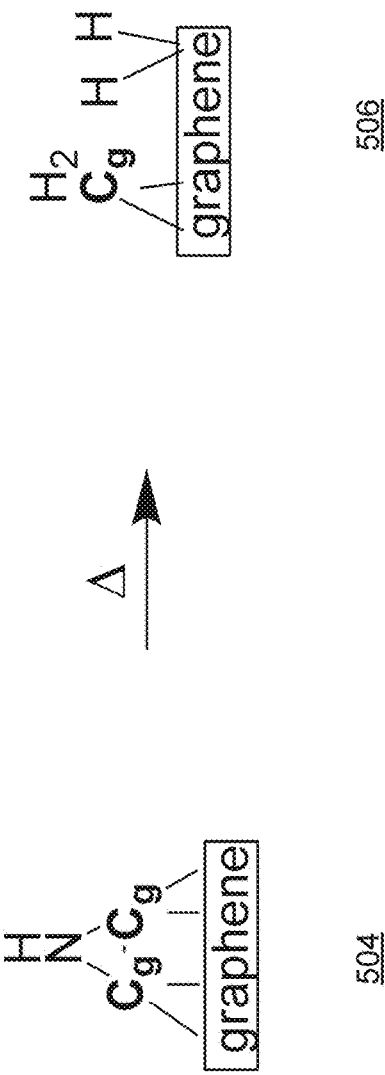
FIG. 5B depicts an example reaction scheme which may be employed for forming pores containing single carbon vacancy defects from nitrene reagents.

FIG. 5B depicts an example reaction scheme corresponding to a portion of the general scheme shown in FIG. 4A and FIG. 4B which may be employed for forming pores containing single carbon vacancy defects. In various examples, N—H aziridine moieties represented by structural formula 504 may be heated. In some examples, N—H aziridine moieties represented by structural formula 504 may be heated in the presence of hydrogen gas. Suitable temperatures range from between about 700° C. to about 900° C., in various examples between about 750° C. to about 850° C., or in some examples about 800° C. Suitable reaction times range from about 1 minute to about 12 hours, in various examples from about 10 minutes to about 4 hours, in some examples from about 15 minutes to about 2 hours, or in other examples, about 30 minutes. In various examples, suitable hydrogen gas conditions range from a pressure of hydrogen from about 1 Torr to about 7600 Torr; in some examples from about 1 Torr to about 760 Torr; or in other examples, from about 10 Torr to about 100 Torr, for example, 50 Torr. Other suitable hydrogen gas conditions may include a flow of hydrogen gas from about 1 sccm to about 25 sccm, in various examples from about 1 sccm to about 5 sccm, or in some examples about 3 sccm. The N—H group and one Cg may be thermolytically cleaved from the surface of structure 504. Passivation with hydrogen may provide structure 506, a graphene monolayer with a pore defined by the removal of a single graphene carbon Cg. Perforated graphene structure 506 corresponds to the single-carbon vacancy defect of discrete pore 108, for example as depicted in perforated graphene monolayer 106 in FIG. 1C.

Figure 5C:
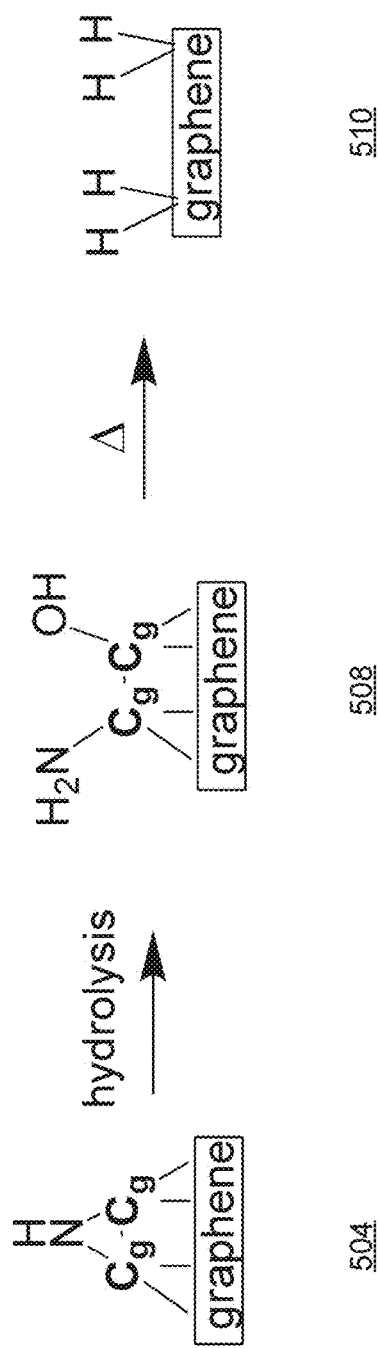
FIG. 5C depicts an example reaction scheme which may be employed for forming pores containing double carbon vacancy defects from nitrene reagents.

FIG. 5C depicts an example reaction scheme corresponding to a portion of the general scheme shown in FIG. 4A and FIG. 4B which may be employed for forming pores containing double carbon vacancy defects. In various examples, the N—H aziridine moieties represented by structure 504 may be hydrolyzed to produce beta-amino alcohol moieties each represented by structural formula 508. The hydrolysis reaction may be conducted by contacting structure 504 with a basic aqueous solution of an alkali metal hydroxide or an alkaline earth metal oxide or hydroxide. The hydrolysis reaction may employ the basic aqueous solution in a concentration range from about 0.1 molar to about 10 molar, for example, about 1 molar. In various examples, the hydrolysis reaction may be conducted at a temperature between: about 0° C. and about 100° C.; about 10° C. and about 90° C.; about 20° C. and about 80° C.; or about 25° C. and about 75° C.; The hydrolysis reaction may be followed by rinsing with water and/or an aqueous buffer solution, for example, a pH 7 buffer solution.

Following the hydrolysis reaction, the plurality of N—H aziridine moieties represented by structural formula 508 may be heated under hydrogen to a temperature between about 750° C. and about 900° C. to produce the plurality of pores in the graphene monolayer as a plurality of double-carbon vacancy defects each represented by structural formula 510. The $Cg\text{-}NH_2$ and Cg-OH groups may be may be thermolytically cleaved from the surface of beta-amino alcohol structure 508. Thermolytic cleavage may evolve one or more gases, for example, hydrogen cyanide, hydrogen, carbon monoxide, ammonia, water, or the like. Passivation with hydrogen may be employed to provide structure 510, a graphene monolayer with a pore defined by the removal of two graphene carbons Cg. Perforated graphene structure 510 corresponds to the double-carbon vacancy defect of discrete pore 122, for example as depicted in perforated graphene monolayer 120 in FIG. 1E.

Figure 5D:
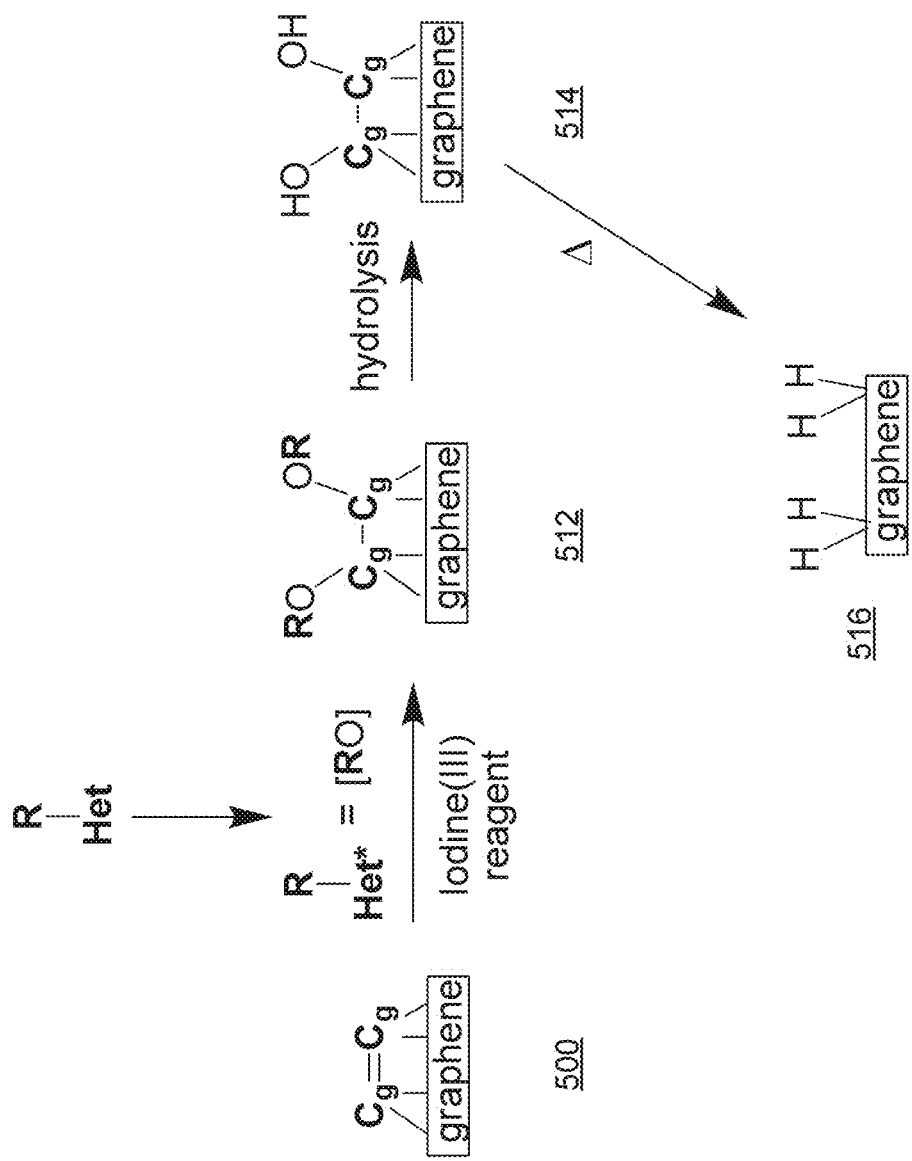
FIG. 5D depicts an example reaction scheme which employs a 1,2 diether to form a 1,2 diol intermediate compound in the course of forming pores containing double carbon vacancy defects from activated oxy reagents.

FIG. 5D depicts an example reaction scheme corresponding to a portion of the general scheme shown in FIG. 4A and FIG. 4B, which employs a 1,2 diether to form a 1,2 diol intermediate compound represented by structure 514. Graphene monolayer 500 may be contacted with an activated oxy reagent represented by R-Het*, wherein R may be —$R^a$. The activated oxy reagent represented by R-Het* may be prepared by combining a suitable precursor of an activated oxy reagent represented by R-Het with an activating reagent, such as a trivalent iodosoaryl reagent. Suitable iodosoaryl reagents may include, for example, iodosobenzene tetrafluoroborate, iodosobenzene hexafluoroantimonate, iodosobenzene hexafluorophosphate, or the like.

Trivalent iodosoaryl reagents may be prepared by combining a chloroform solution of (diacetoxyiodo)benzene with an aqueous solution of a suitable acid, e.g., tetrafluoroboric acid, hexafluoroantimonic acid, or hexafluorophosphoric acid. The mixture may be evaporated under vacuum at 40° C. to 50° C. The product, e.g., iodosobenzene tetrafluoroborate, iodosobenzene hexafluoroantimonate, or iodosobenzene hexafluorophosphate, may be crystallized by adding a small amount of water.

Suitable precursors of activated oxy reagents represented by R-Het, wherein R may be —$R^a$ may include alcohols of formula R—OH, salts of R—$O^-$ with alkaline metal cations, salts of R—$O^-$ with alkaline earth metal cations, or the like. Carbon-carbon double bond $C_g=C_g$ in graphene monolayer 500 may react in the presence of the trivalent iodosoaryl reagent and R-Het* to form a graphene monolayer functionalized with a 1,2-diether represented by structure 512.

In various examples, the RO ether groups may be cleaved from structure 512 to form the 1,2 diol intermediate compound represented by structure 514. In various examples, 1,2 diether structure 512 may be reacted with one or more of hydrobromic acid, hydroiodic acid, boron tribromide, or aluminium trichloride.

Figure 5E:
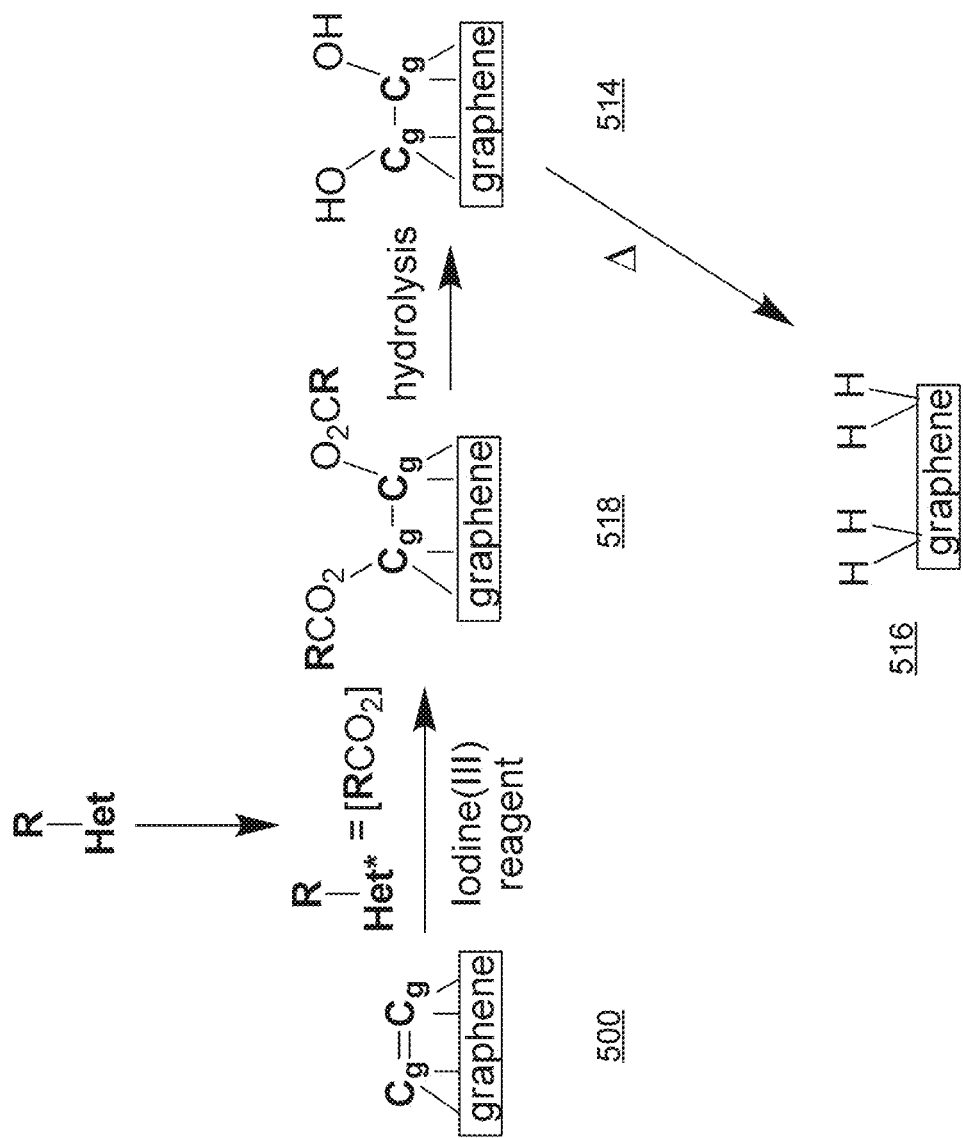
FIG. 5E depicts an example reaction scheme which employs a 1,2 diester moiety to form a 1,2 diol intermediate compound in the course of forming pores containing double carbon vacancy defects from activated oxy reagents.

FIG. 5E depicts an example reaction scheme corresponding to a portion of the general scheme shown in FIG. 4A and FIG. 4B, which employs a 1,2 diester moiety to form the 1,2 diol intermediate compound represented by structure 514.

Referring to FIG. 5E, in various examples, graphene monolayer 500 may be reacted with a trivalent iodosoaryl reagent and a carboxyl precursor R-Het, wherein R may be —$R^a$.

In various examples, the trivalent iodosoaryl reagent may include, for example, iodosobenzene tetrafluoroborate, iodosobenzene hexafluoroantimonate, or iodosobenzene hexafluorophosphate, prepared as described under the description for FIG. 5D.

In various examples, suitable carboxyl precursors of activated oxy reagents represented by R-Het, wherein R may be —$R^a$ may include: carboxylic acids of formula R—$CO_2H$; salts of R—$CO_2^-$ with alkaline metal cations; salts of R—$CO_2^-$ with alkaline earth metal cations; or the like. Carbon-carbon double bond $C_g=C_g$ in graphene monolayer 500 may react with the trivalent iodosoaryl reagent and the carboxyl precursor represented by R-Het to form a graphene monolayer functionalized with a 11,2-diester moiety represented by structure 518.

Referring to FIG. 5E, in various examples, the iodosylaryl reagent and the carboxyl precursor R-Het may together form a complex corresponding to R-Het*. For example, R-Het* may represent (bis(R—$CO_2$) iodo(III)) benzene, which may be formed by reacting benzene, potassium peroxodisulfate, elemental iodine, and R-Het=R—$CO_2H$ in the presence of concentrated sulfuric acid. In various examples, graphene monolayer 500 may be reacted with bis(R—$CO_2$)iodo(III)) benzene and a copper(I) or copper(II) salt of: trifluoromethanesulfonate; perchlorate; methanesulfonate; sulfonate; methylphenylsulfonate; bromophenylsulfonate; nitrophenylsulfonate; or the like. Carbon-carbon double bond $C_g=C_g$ in graphene monolayer 500 may react with the bis(R—$CO_2$)iodo(III))benzene to form a graphene monolayer functionalized with a 1,2-diester moiety represented by structure 518.

Referring to FIG. 5E, in various examples, the $RCO_2$—Cg carboxyl groups in 1,2-diester moiety 518 may be hydrolyzed to form the 1,2 diol compound represented by structure 514. In various examples, suitable conditions may include contacting 1,2-diester moiety 518 with an acid or base under conditions suitable for hydrolyzing the 1,2-diester moiety 518 to form the 1,2 diol compound represented by structure 514. In various examples, suitable acids may include HF, HCl, HBr, HI, $H_2SO_4$, phosphoric acid, methanesulfonic acid, trifluoromethanesulfonic acid, methylphenylsulfonic acid; bromophenylsulfonic acid; nitrophenylsulfonic acid, or the like. In various examples, suitable conditions may include contacting 1,2-diester moiety 518 with a base, for example, an alkaline metal hydroxide, an alkaline earth metal hydroxide, an alkaline earth metal oxide, or the like. In other examples, a suitable base may include a quaternary ammonium hydroxide, for example, tetramethylammonium hydroxide, tetrabutylammonium hydroxide, or the like. In various examples, a quaternary ammonium salt may be added, for example, tetrabutylammonium sulfate, tetraethylammonium bromide, or the like. In various examples, suitable conditions may include providing a source of water. In various examples, suitable conditions may include a biphasic system including an aqueous phase and an organic phase, where the organic phase may include tetrahydrofuran, dioxane, diethyl ether, or the like. In various examples, suitable conditions may include heating between about 20° C. and about 100° C. In various examples, wherein a biphasic system may be employed, suitable conditions may include heating between about 20° C. and about the boiling temperature of the organic phase, e.g., tetrahydrofuran.

Referring again to FIG. 5D and FIG. 5E, in various examples, the 1,2 diol intermediate compound represented by structure 514 may be thermolytically cleaved and passivated to provide structure 516, a graphene monolayer with a pore defined by the removal of two graphene carbons Cg. The 1,2 diol intermediate compound represented by structure 514 may be heated. In some examples, 1,2 diol intermediate compound represented by structure 514 may be heated in the presence of hydrogen gas. Suitable temperatures range from between about 700° C. to about 900° C., in various examples between about 750° C. to about 850° C., or in some examples about 800° C. Suitable reaction times range from about 1 minute to about 12 hours, in various examples from about 10 minutes to about 4 hours, in some examples from about 15 minutes to about 2 hours, or in other examples, about 30 minutes. In various examples, suitable hydrogen gas conditions range from a pressure of hydrogen from about 1 Torr to about 7600 Torr; in some examples from about 1 Torr to about 760 Torr; or in other examples, from about 10 Torr to about 100 Torr, for example, 50 Torr. Other suitable hydrogen gas conditions may include a flow of hydrogen gas from about 1 sccm to about 25 sccm, in various examples from about 1 sccm to about 5 sccm, or in some examples about 3 sccm. The two Cg-OH groups may be thermolytically cleaved from the surface of structure 514. Thermolytic cleavage may evolve one or more species, for example, hydrogen, hydroxyl, carbon monoxide, carbon dioxide, water, or the like. Passivation with hydrogen may be employed to provide structure 516, a graphene monolayer with a pore defined by the removal of two graphene carbons Cg. Perforated graphene structure 516 corresponds to the double-carbon vacancy defect of discrete pore 122, for example as depicted in perforated graphene monolayer 120 in FIG. 1D.

Example embodiments may also include methods of making an example membrane that includes a graphene layer perforated by a plurality of nanoscale pores; and a gas sorbent that is configured to contact a surface of the graphene layer, where the gas sorbent is configured to direct at least one gas adsorbed at the gas sorbent into the nanoscale pores. Example embodiments may also include preparation of any other feature described herein, for example, a perforated graphene monolayer. These methods may be implemented in any number of ways, including the structures described herein. One such way may be by machine operations, of devices of the type described in the present disclosure. Another optional way may be for one or more of the individual operations of the methods to be performed in conjunction with one or more human operators performing some of the operations while other operations may be performed by machines. These human operators need not be collocated with each other, but each can be only with a machine that performs a portion of the program. In other examples, the human interaction may be automated such as by pre-selected criteria that may be machine automated.

Figure 6A:
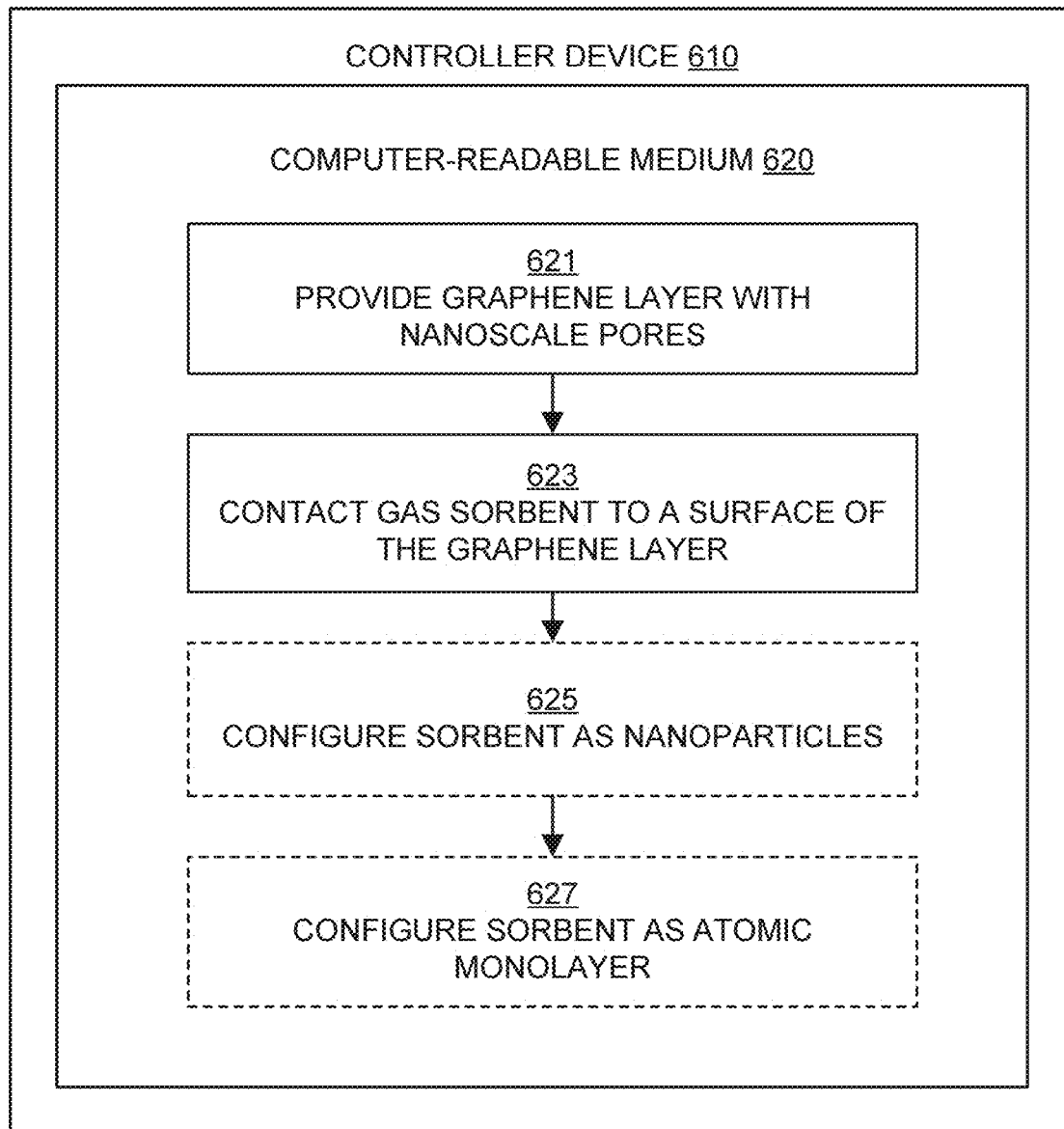
FIGS. 6A and 6B are flow diagrams showing operations that may be used in making an example membrane and an example perforated graphene monolayer.
Figure 6B:
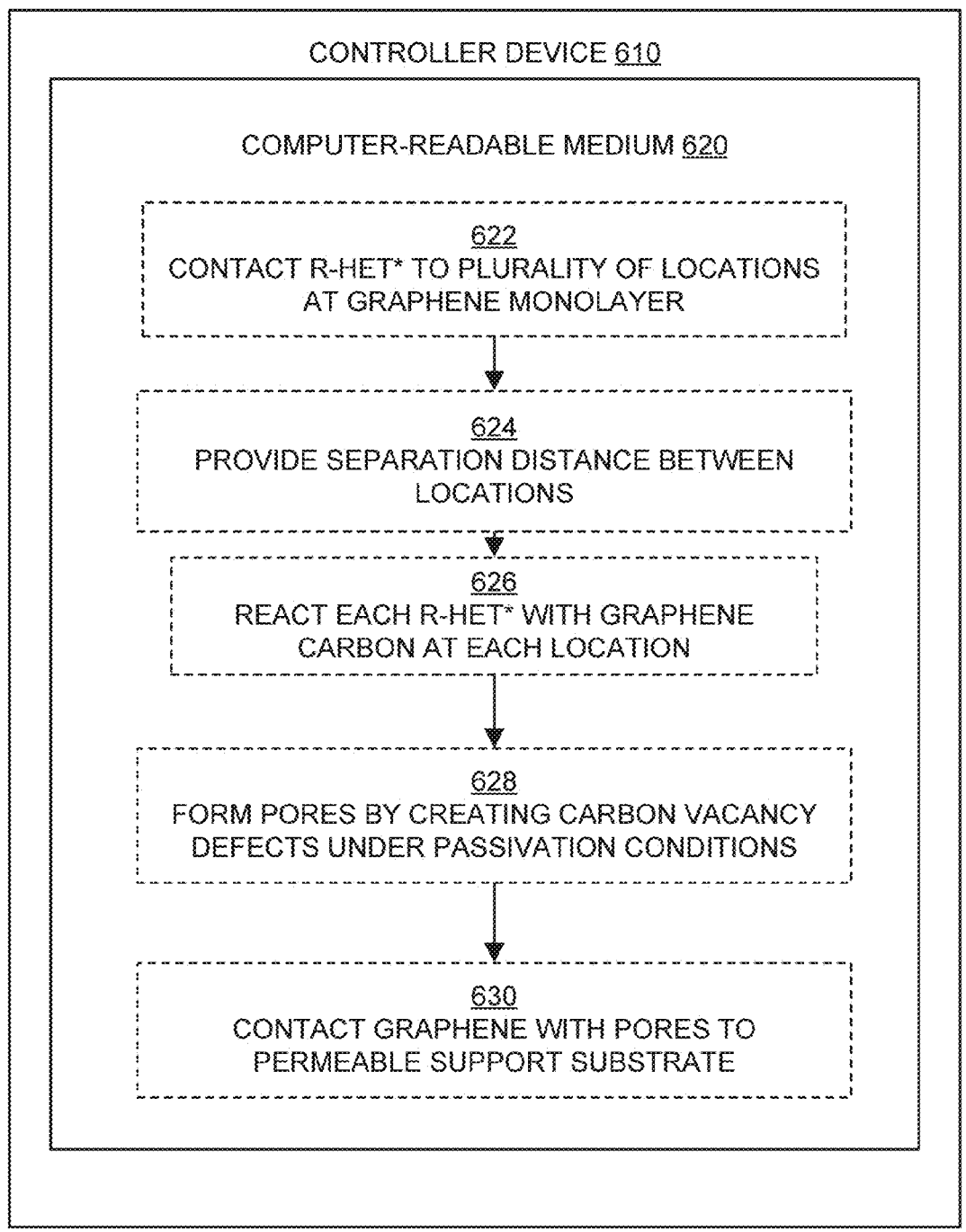

FIG. 6A is a flow diagram showing operations that may be used in making an example membrane, such as membranes 202, 212, 222, 232, and 300 in accordance with at least some embodiments described herein. FIG. 6B is a flow diagram showing additional operations that may be used in making an example perforated graphene monolayer, such as perforated graphene monolayers 106 or 120 in accordance with at least some embodiments described herein.

Referring first to FIG. 6A, a method of making an example membrane may include one or more operations, actions or functions as illustrated by one or more of blocks 621, 623, 625, and/or 627. The method may begin with operation "PROVIDE GRAPHENE LAYER WITH NANOSCALE PORES", such as graphene monolayer 106. In various examples, operation 621 may include obtaining a graphene membrane. In some examples, operation 621 may include preparing a graphene membrane. Controller device 610 may be embodied as computing device 800, manufacturing controller 790, or similar devices executing instructions stored in computer-readable medium 620 for controlling the performance of the method. Controller device 610 may operate "GRAPHENE MANIPULATOR" machine 791 of FIG. 7A to carry out operation 621. Machine 791 may include one or more manipulating functions, such as micromanipulators, contact printing manipulators, electrostatic manipulators, gas or vacuum manipulators, or the like.

The method of making an example membrane may include an operation 623, "CONTACT GAS SORBENT TO A SURFACE OF THE GRAPHENE LAYER", e.g., to produce the gas sorbent configurations depicted in FIGS. 2A-2D. In various examples, the method of making an example membrane may include an optional operation 625, "CONFIGURE SORBENT AS NANOPARTICLES". Many gas sorbents are available in nanoparticle formulations, for example, palladium suitable for hydrogen adsorption is commercially available as colloidal nanoparticles. In various examples, a method of making an example membrane may include an operation 627, "CONFIGURE SORBENT AS ATOMIC MONOLAYER". Gas sorbents such as palladium and other metals may be applied as atomic monolayers by atomic vapor deposition, atomic layer deposition, or chemical vapor deposition, or in some examples, via electrochemical deposition using the graphene layer as a cathode.

Controller device 610 may operate "SORBENT DEPOSITOR" machine 793 to carry out operations 623, 625, and/or 627, optionally in conjunction with "GRAPHENE MANIPULATOR" machine 791. Controller device 610 may provide machine 793 and/or 791 with parameters regarding, for example, the location and patterning of applying the gas sorbent, the chemical or physical parameters for deposition of the gas sorbent, or the like.

Referring now to FIG. 6B, a method of making an example perforated graphene monolayer such as 106 or 120 may include an operation 622, "CONTACT R-HET* TO PLURALITY OF LOCATIONS AT GRAPHENE MONOLAYER", such as graphene monolayer 100. The reagent may be contacted to the graphene monolayer in any suitable form, such as a solid, a liquid, a gas, a solute in a solution, particles in a suspension, or the like. The R-Het* reagent may be contacted to the graphene monolayer by any suitable apparatus or method, such as by employing: a solution coating apparatus; a spin coating apparatus; a dip coating apparatus; selective coating apparatus, e.g., applied via a pressurized fluid applicator, e.g., an ink-jet type nozzle; sublimation or condensation using a condenser, a vacuum chamber, and/or a heater; chemical vapor deposition; or the like.

Controller device 610 may operate "MIXER/REACTOR/R-HET* ADDITION/APPLICATOR" machine 792 to perform operation 622. Machine 792 may include one or more mixing functions, such as mechanical stirring, heating, ultrasonication for dissolving and/or reacting reagents as described above. Machine 792 may also include one or more application or coating functions for contacting reagents such as R-Het* to the graphene. At operation 622, manufacturing controller 790 may instruct machine 792 with parameters regarding, for example, the extent of mechanical stirring or reaction based on the reagents employed. Operation 622 may be continued until a desired point may be reached, e.g., the reaction has proceeded for a sufficient length of time to functionalize the surface of the graphene monolayer.

In some examples, the R-Het* reagent may be prepared in the presence of the graphene monolayer by activating a R-Het* precursor to form an activated heteroatom such as R-nitrene, [RO] or [RCO$_2$], as discussed above under FIGS. 5A, 5B, 5C, 5D, and 5E. In various examples, suitable reagent activator apparatus may include one or more of: a resistive heating element; an infrared laser; an ultraviolet light source; and/or one or more reagent reservoirs, e.g., a reaction chamber configured to contact a precursor compound R-Het and a trivalent iodosoaryl compound; or the like.

Referring again to FIG. 6B, the method may include an operation 624, "PROVIDE SEPARATION DISTANCE BETWEEN LOCATIONS", such as separation distances 104 or 118. In various examples, the separation distance may be provided by selecting an R group with the desired amount of steric bulk, where the separation distance may be at least about twice the minimum steric radius $r_R$ of group R. In some examples, the separation distance may be increased, for example, by running the reaction at a low concentration of R-Het* such that the surface of the graphene monolayer may be sparsely reacted. In some examples, the separation distance may be modulated indirectly by contacting graphene monolayer with R-Het* at selected locations via patterned application of R-Het* using a pressurized fluid applicator, or the like.

The method may include an operation 626, "REACT EACH R-HET* WITH GRAPHENE CARBON AT EACH LOCATION". In some examples, the reaction may occur upon contact of R-Het* with the graphene monolayer. In other examples, a R-Het may be activated at selected sites at the graphene monolayer. For example, when R-Het may be R-azide, an ultraviolet light source such as an ultraviolet lamp, an ultraviolet light emitting diode, or a collimated light source such as an ultraviolet laser may be used to photolytically generate R-Het* as R-nitrene. In some examples, a collimated light source such as an ultraviolet laser may be used to photolytically generate R-Het* as R-nitrene at specific sites on the graphene monolayer. Controller device 610 may operate "HEATER/PHOTOLYZER" machine 794, optionally in conjunction with machine 792 to perform operations 624 and 626. Controller device 610 may provide machine 792 and/or machine 794 with parameters regarding, for example, the location and patterning of applying the R-Het* reagent, the location and patterning of activating the R-Het* reagent from a R-Het precursor, e.g. by photolytic activation, heating, or the like. Operation 624 may be continued until a desired point may be reached, e.g., the graphene monolayer has had sufficient time to react to the desired level of functionalization.

The method may include an operation 628, "FORM PORES BY CREATING CARBON VACANCY DEFECTS UNDER PASSIVATION CONDITIONS", such as pores 108 and 122. In some examples, pores such as 108 and 122 may be formed by heating a precursor such as aziridine 504, beta amino alcohol 508, 1,2 diol 514, or the like. Suitable apparatus components for forming pores 108 and 122 may include a heater, such as a resistive heating element or an infrared laser. Suitable apparatus components for forming pores 108 and 122 may also include a hydrogen source, e.g., a reaction chamber configured to apply a partial pressure of hydrogen or a flow of hydrogen while heating may be conducted. Controller device 610 may also operate "HEATER/PHOTOLYZER" machine 794, optionally in conjunction with "HYDROGEN PASSIVATION SOURCE" 796 to perform operation 628. Operation 628 may be continued until a desired point may be reached, e.g., the functionalized graphene monolayer has had sufficient time to react to form and passivate the discrete pores, such as pores 108 or 122.

The method may include an operation 630, "CONTACT GRAPHENE WITH PORES TO PERMEABLE SUPPORT SUBSTRATE". Operation 630 may include preparing an example perforated graphene monolayer as described herein from a graphene monolayer produced on thin, e.g., 25 micrometer thick copper foil. Operation 630 may also include one or more actions such as: depositing and curing a layer of a suitable transfer polymer on the perforated graphene monolayer; etching to remove the copper foil; washing the resulting perforated graphene monolayer/cured polymer; contacting the perforated graphene monolayer surface to a suitable permeable substrate; redepositing and curing a second layer of polymer; washing the combined polymer layers away with a solvent such as acetone. Suitable polymers for operation 630 may include, for example, polymethyl methacrylates. Suitable apparatus for operation 630 may include apparatus for coating the polymethyl methacrylate, e.g., solution coaters, spin coaters, dip coaters, and the like. Suitable apparatus for operation 630 may also include a curing oven or ultraviolet light source for curing the polymethyl methacrylate. Additional suitable apparatus for operation 630 may include etching and washing chambers. Further suitable apparatus for operation 630 may include apparatus for contacting the contacting the perforated graphene monolayer surface to a suitable permeable substrate, such as a contact press. At operation 630, the processor (e.g., processor 804) may control applicator, mixer, and reactor functions of machine 792 to transfer the perforated graphene monolayer to a permeable substrate such as 302, to form a membrane such as 300. Operation 630 may include one or more functions such as: melt processing; solvent evaporation; reduced pressure solvent evaporation; spin coating; dip coating; spray coating; solvent casting; doctor blading; removal of solvent under supercritical conditions; polymerization in situ from precursors of the polymer; curing or crosslinking the polymer in situ; contact printing; metal etching; polymer etching/dissolution; or the like.

The operations included in the process of FIGS. 6A and 6B described above are for illustration purposes. A process of making an example perforated graphene monolayer or membrane as described herein may be implemented by similar processes with fewer or additional operations. In some examples, the operations may be performed in a different order. In some other examples, various operations may be eliminated. In still other examples, various operations may be divided into additional operations, or combined together into fewer operations. Although illustrated as sequentially ordered operations, in some implementations the various operations may be performed in a different order, or in some cases various operations may be performed at substantially the same time.

In various examples, operations described herein may include contacting reagents to the graphene monolayer or perforated graphene monolayer. For example, operation 621 may include contacting a chemical precursor such as a monomer for forming a polymeric gas sorbent; operation 622 may include contacting a reagent R-Het* to a graphene monolayer; operation 630 may include contacting and curing a polymer to the perforated graphene monolayer; and the like. Such methods may include one or more techniques such as: melt processing; solvent evaporation; reduced pressure solvent evaporation; spin coating; dip coating; spray coating; ink-jet style printing; solvent casting; doctor blading; removal of solvent under supercritical conditions; polymerization in situ from precursors of the polymer; curing or crosslinking the polymer in situ, or the like. Specific details of suitable polymer processing conditions may be selected based on the particular gas sorbent, R-Het*, or polymer. For example, typical solution casting methods employ high boiling solvents of the polymer in question.

Figure 7A:
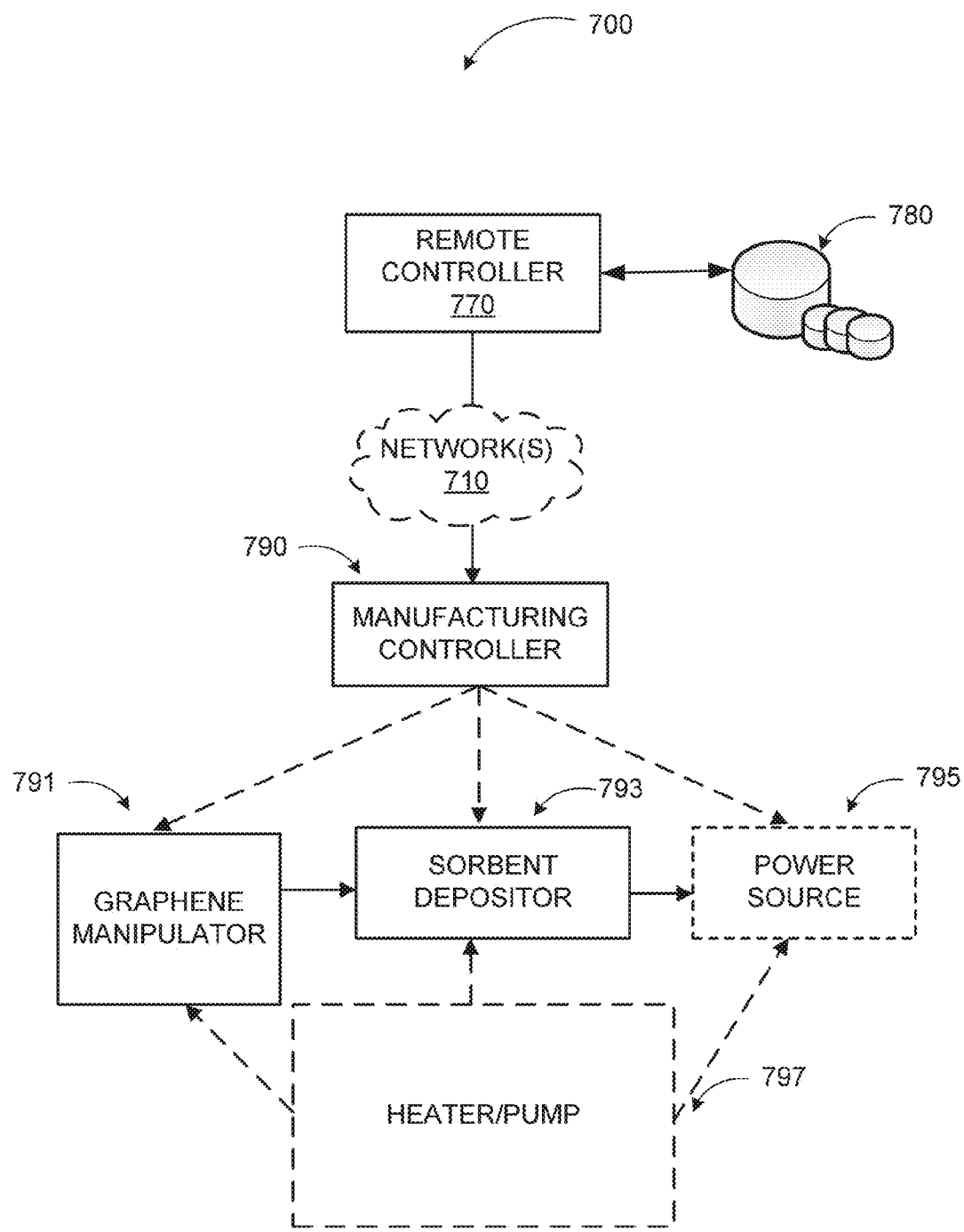
FIGS. 7A and 7B are block diagrams of an automated machine 700 that may be used for making an example membrane or example perforated graphene monolayer.

FIG. 7A is a block diagram of an automated machine 700 that may be used for making an example membrane in accordance with at least some embodiments described herein. As illustrated in FIG. 7A, "MANUFACTURING CONTROLLER" 790 may be coupled to machines that may be used to carry out the operations described herein, for example, "GRAPHENE MANIPULATOR" 791, "SORBENT DEPOSITOR" 793, "POWER SOURCE" 795, and/or "HEATER/PUMP" 797.

Machine 793 may employ an electrochemical apparatus to electrodeposit one or more layers of nanoparticles, e.g., from a suspension of colloidal palladium nanoparticles. Machine 793 may be employed to electrodeposit one or more atomic layers of sorbent, e.g., from a solution of palladium. For example, a solution of a metal gas adsorbent such as palladium may be electrochemically deposited on graphene layer 202, using 202 as the cathode in an electrochemical plating circuit. In some examples, machine 793 may employ a chemical deposition chamber to precipitate one or more layers of gas sorbent as nanoparticles or one or more atomic layers, e.g., from a chemical solution of palladium. In some examples, machine 793 may employ a dip coating apparatus, a spin coating apparatus, a contact printing apparatus, or a pressurized jet coating apparatus such as an ink jetstyle applicator. Machine 793 may be employed to apply one or more layers of gas sorbent as nanoparticles or one or more atomic layers, e.g., from a chemical solution or suspension of molecular or colloidal gas sorbent. For example, a suitable solution may include a polymeric gas sorbent dissolved in a solvent. In another example, a suitable suspension may include a colloidal suspension of activated carbon nanoparticles. In some examples, machine 793 may employ an atomic vapor deposition chamber or a chemical vapor deposition chamber to grow one or more layers of gas sorbent nanoparticles or to deposit one or more atomic layers of gas sorbent. In some examples, machine 793 may employ an electrostatic depositor such as a powder coating apparatus similar to a laser printer mechanism to electrostatically deposit one or more layers of gas sorbent nanoparticles.

Figure 7B:
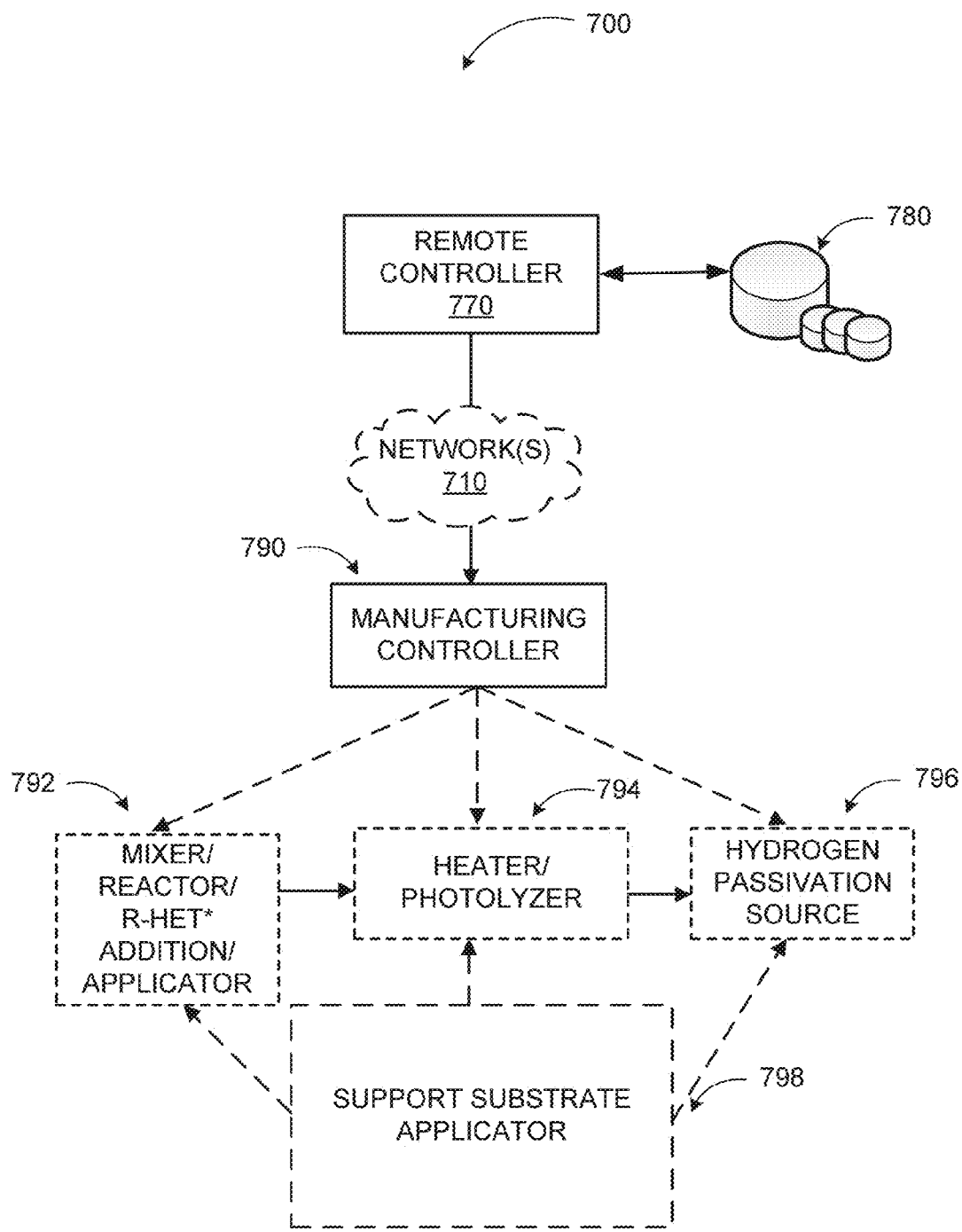

FIG. 7B is a block diagram of further machine elements that may be coupled to automated machine 700 for making an example perforated graphene monolayer in accordance with at least some embodiments described herein. As illustrated in FIG. 7B, manufacturing controller 790 may be coupled to machines that may be used to carry out the operations described herein, for example, "MIXER/REACTOR/R-HET* ADDITION/APPLICATOR" 792, "HEATER/PHOTOLYZER" 794, "HYDROGEN PASSIVATION SOURCE" 796, and/or "SUPPORT SUBSTRATE APPLICATOR" 798.

Manufacturing controller 790 may be operated by human control, or may be directed by a remote controller 770 via network 710. Data associated with controlling the different processes of making the perforated graphene monolayers and membranes thereof may be stored at and/or received from data stores 780.

FIG. 8 illustrates a general purpose computing device that may be used to control the automated machine 700 of FIG. 7A or 7B or similar manufacturing equipment in making an example membrane, in accordance with at least some embodiments described herein. In a basic configuration 802, computing device 800 typically may include one or more processors 804 and a system memory 806. A memory bus 808 may be used for communicating between processor 804 and system memory 806.

Depending on the desired configuration, processor 804 may be of any type including but not limited to a microprocessor (µP), a microcontroller (µC), a digital signal processor (DSP), or any combination thereof. Processor 804 may include one more levels of caching, such as a level cache memory 812, a processor core 814, and registers 816. Example processor core 814 may include an arithmetic logic unit (ALU), a floating point unit (FPU), a digital signal processing core (DSP Core), or any combination thereof. An example memory controller 818 may also be used with processor 804, or in some implementations memory controller 815 may be an internal part of processor 804.

Depending on the desired configuration, system memory 806 may be of any type including but not limited to volatile memory (such as RAM), non-volatile memory (such as ROM, flash memory, etc.) or any combination thereof. System memory 806 may include an operating system 820, one or more manufacturing control applications 822, and program data 824. Manufacturing control application 822 may include a control module 826 that may be arranged to control automated machine 700 of FIGS. 7A and 7B and any other processes, methods and functions as discussed above. Program data 824 may include, among other data, material data 828 for controlling various aspects of the automated machine 700. This described basic configuration 802 is illustrated in FIG. 8 by those components within the inner dashed line.

Computing device 800 may have additional features or functionality, and additional interfaces to facilitate communications between basic configuration 802 and any required devices and interfaces. For example, a bus/interface controller 830 may be used to facilitate communications between basic configuration 802 and one or more data storage devices 832 via a storage interface bus 834. Data storage devices 832 may be removable storage devices 836, non-removable storage devices 838, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 806, removable storage devices 836 and non-removable storage devices 838 may be examples of computer storage media. Computer storage media may include, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 800. Any such computer storage media may be part of computing device 800.

Computing device 800 may also include an interface bus 840 for facilitating communication from various interface devices (e.g., output devices 842, peripheral interfaces 844, and communication devices 866 to basic configuration 802 via bus/interface controller 830. Example output devices 842 may include a graphics processing unit 848 and an audio processing unit 850, which may be configured to communicate to various external devices such as a display or speakers via one or more A/V ports 852. Example peripheral interfaces 844 may include a serial interface controller 854 or a parallel interface controller 856, which may be configured to communicate with external devices such as input devices (e.g., keyboard, mouse, pen, voice input device, touch input device, etc.) or other peripheral devices (e.g., printer, scanner, etc.) via one or more I/O ports 858. An example communication device 866 may include a network controller 860, which may be arranged to facilitate communications with one or more other computing devices 862 over a network communication link via one or more communication ports 864.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 800 may be implemented as a portion of a physical server, virtual server, a computing cloud, or a hybrid device that may include any of the above functions. Computing device 800 may also be implemented as a personal computer including both laptop computer and non-laptop computer configurations. Moreover computing device 800 may be implemented as a networked system or as part of a general purpose or specialized server.

Networks for a networked system including computing device 800 may comprise any topology of servers, clients, switches, routers, modems, Internet service providers, and any appropriate communication media (e.g., wired or wireless communications). A system according to embodiments may have a static or dynamic network topology. The networks may include a secure network such as an enterprise network (e.g., a LAN, WAN, or WLAN), an unsecure network such as a wireless open network (e.g., IEEE 802.11 wireless networks), or a world-wide network such (e.g., the Internet). The networks may also comprise a plurality of distinct networks that may be adapted to operate together. Such networks may be configured to provide communication between the nodes described herein. By way of example, and not limitation, these networks may include wireless media such as acoustic, RF, infrared and other wireless media. Furthermore, the networks may be portions of the same network or separate networks.

Figure 9A:
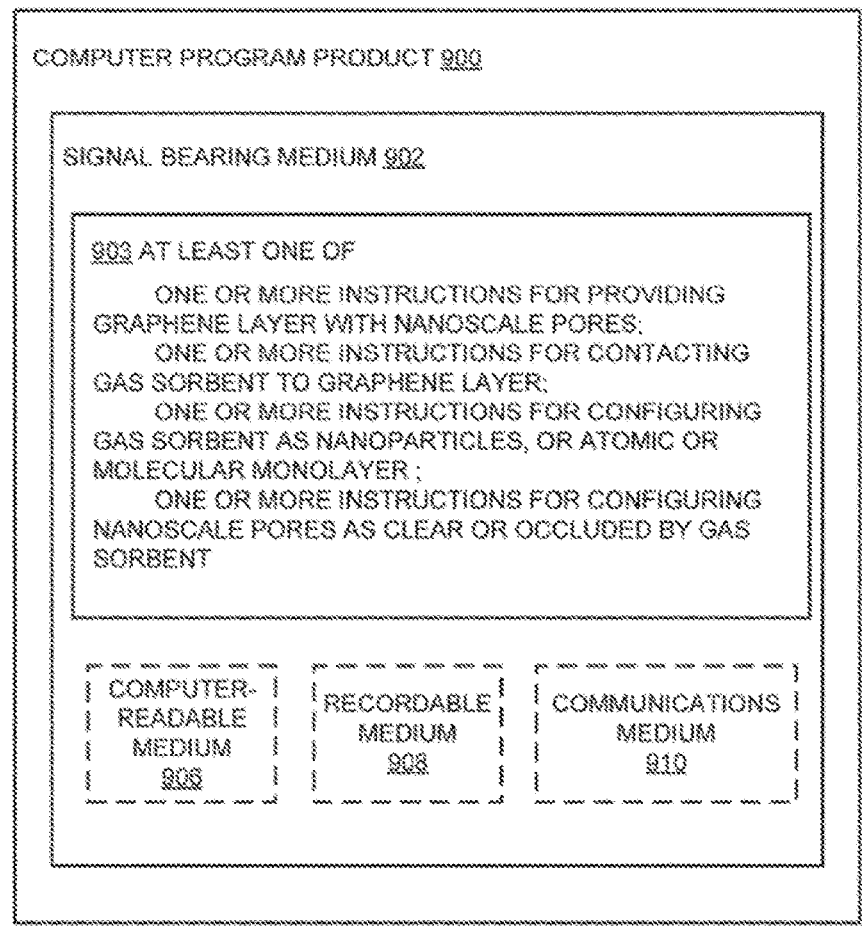
FIGS. 9A and 9B illustrate a block diagram of an example computer program product that may be used to control the automated machine of FIGS. 7A and 7B or similar manufacturing equipment in making an example membrane or example perforated graphene monolayer.
Figure 9B:
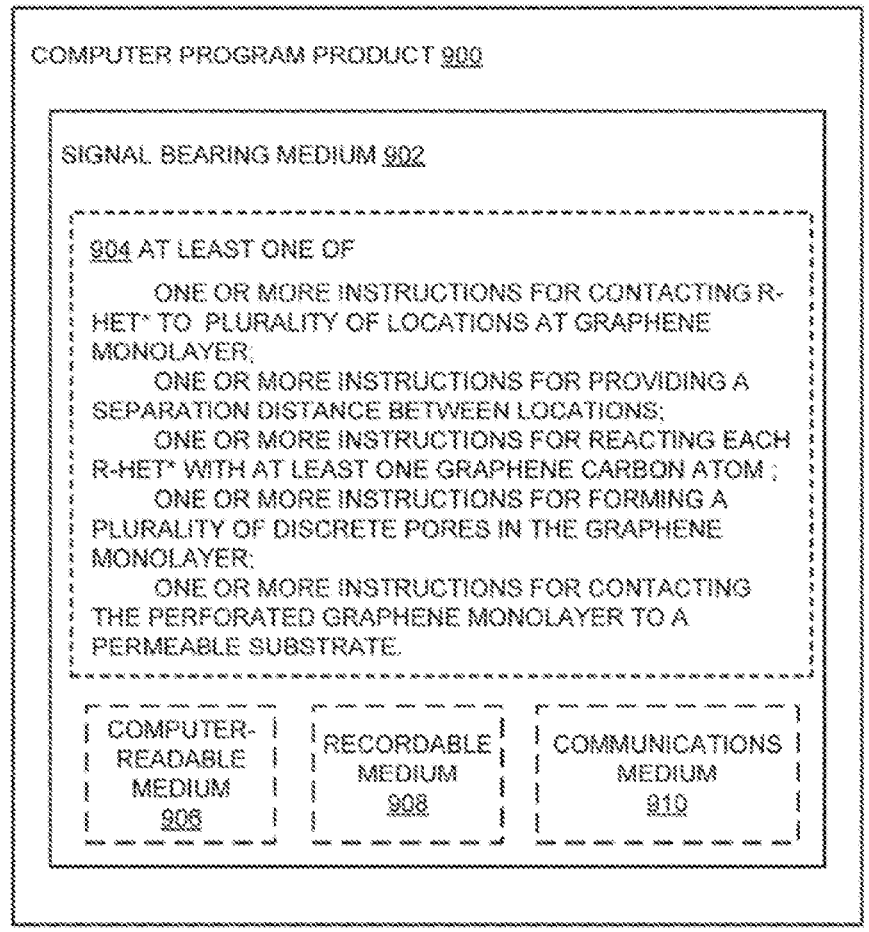

FIGS. 9A and 9B illustrate a block diagram of an example computer program product that may be used to control the automated machine of FIGS. 7A and 7B or similar manufacturing equipment in making an example membrane, arranged in accordance with at least some embodiments described herein. In some examples, as shown in FIGS. 9A and 9B, computer program product 900 may include a signal bearing medium 902 that may also include machine readable instructions 903 and 904 that, when executed by, for example, a processor, may provide the functionality described above with respect to FIG. 6A through FIG. 8. For example, referring to processor 804, one or more of the tasks shown in FIG. 9A or 9B may be undertaken in response to instructions 903 or 904 conveyed to the processor 804 by signal bearing medium 902 to perform operations associated with making an example membrane or example perforated graphene monolayer as described herein.

Some of those instructions may include, for example, one or more instructions 903 for: providing a graphene layer with nanoscale pores; contacting a gas sorbent to a graphene layer; configuring a gas sorbent as nanoparticles, or an atomic monolayer; and/or configuring nanoscale pores as clear or occluded by gas sorbent.

Some of those instructions may include, for example, one or more instructions 904 for: contacting R-Het* to a plurality of locations at a graphene monolayer; providing a separation distance between locations; reacting each R-Het* with at least one graphene carbon atom; forming a plurality of discrete pores in the graphene monolayer; and/or contacting the perforated graphene monolayer to a permeable substrate.

In some implementations, signal bearing medium 902 depicted in FIGS. 9A and 9B may encompass a computer-readable medium 906, such as, but not limited to, a hard disk drive, a Compact Disc (CD), a Digital Versatile Disk (DVD), a digital tape, memory, etc. In some implementations, signal bearing medium 902 may encompass a recordable medium 908, such as, but not limited to, memory, read/write (R/W) CDs, R/W DVDs, etc. In some implementations, signal bearing medium 902 may encompass a communications medium 910, such as, but not limited to, a digital and/or an analog communication medium (e.g., a fiber optic cable, a waveguide, a wired communications link, a wireless communication link, etc.). For example, computer program product 900 may be conveyed to the processor 804 by an RF signal bearing medium 902, where the signal bearing medium 902 may be conveyed by a wireless communications medium 910 (e.g., a wireless communications medium conforming with the IEEE 802.11 standard). While the embodiments will be described in the general context of program modules that execute in conjunction with an application program that runs on an operating system on a personal computer, those skilled in the art will recognize that aspects may also be implemented in combination with other program modules.

Generally, program modules may include routines, programs, components, data structures, and other types of structures that perform particular tasks or implement particular abstract data types. Moreover, those skilled in the art will appreciate that embodiments may be practiced with other computer system configurations, including hand-held devices, multiprocessor systems, microprocessor-based or programmable consumer electronics, minicomputers, mainframe computers, and comparable computing devices. Embodiments may also be practiced in distributed computing environments where tasks may be performed by remote processing devices that may be linked through a communications network. In a distributed computing environment, program modules may be located in both local and remote memory storage devices.

Embodiments may be implemented as a computer-implemented process (method), a computing system, or as an article of manufacture, such as a computer program product or computer readable media. The computer program product may be a computer storage medium readable by a computer system and encoding a computer program that comprises instructions for causing a computer or computing system to perform example process(es). The computer-readable storage medium can for example be implemented via one or more of a volatile computer memory, a non-volatile memory, a hard drive, a flash drive, a floppy disk, or a compact disk, and comparable media.

Throughout this specification, the term "platform" may be a combination of software and hardware components for providing a configuration environment, which may facilitate configuration of software/hardware products and services for a variety of purposes. Examples of platforms may include, but are not limited to, a hosted service executed over a plurality of servers, an application executed on a single computing device, and comparable systems. The term "server" generally refers to a computing device executing one or more software programs typically in a networked environment. However, a server may also be implemented as a virtual server (software programs) executed on one or more computing devices viewed as a server on the network. More detail on these technologies and example operations is provided below.

An example membrane may include a graphene layer perforated by a plurality of nanoscale pores. An example membrane may also include a gas sorbent that may be configured to contact a surface of the graphene layer. The gas sorbent may be configured to direct at least one gas adsorbed at the gas sorbent into the nanoscale pores.

In various examples, each of the plurality of nanoscale pores may be characterized by an average diameter in a range from about 0.1 nanometers to about 4 nanometers. In some examples, at least a portion of the pores in the plurality of nanoscale pores may be substantially the same size such that the graphene layer may have substantially uniform pore sizes throughout. In further examples, each of the plurality of nanoscale pores may be characterized by one or more carbon vacancy defects in the graphene monolayer such that the graphene layer may have substantially uniform pore sizes throughout.

In various examples, the gas sorbent may include a plurality of nanoparticles. In some examples, the plurality of gas sorbent nanoparticles may be characterized by a diameter in a range from about 1 nanometer to about 250 nanometers. In some examples, the gas sorbent may include one or more of palladium, platinum, calcium oxide, magnesium oxide, magnesium salen, cobalt salen, and/or a permeable organic polymer. In further examples, the gas sorbent may include at least one of palladium or a permeable organic polymer. In various examples, the gas sorbent may include at least one atomic monolayer. In some examples, the gas sorbent at the surface of the graphene layer may be in a range between about 1 atom and about 1 micron in thickness. In further examples, the gas sorbent may be configured to contact the surface of the graphene layer substantially between the plurality of nanoscale pores. In various examples, at least a portion of the plurality of nanoscale pores may be substantially free from obstruction by the gas sorbent layer. In some examples, at least a portion of the plurality of nanoscale pores may be at least partly occluded by the gas sorbent. In further examples, the gas sorbent may include palladium nanoparticles characterized by an average diameter in a range from about 20 nanometers to about 100 nanometers. In various examples, the gas sorbent excludes gold nanoparticles.

An example method of forming a membrane may include providing a graphene layer that may be perforated by a plurality of nanoscale pores. Some example methods of forming may also include contacting a gas sorbent to a surface of the graphene layer. Various example methods of forming may further include configuring the gas sorbent to increase a surface concentration of at least one gas at the graphene layer.

In various examples of the method of forming a membrane, each of the plurality of nanoscale pores may be characterized by an average diameter in a range from about 0.1 nanometers to about 4 nanometers in diameter. In some examples, at least a portion of the plurality of nanoscale pores may be substantially the same size such that the graphene layer has substantially uniform pore sizes throughout. In further examples, each of the plurality of nanoscale pores may be characterized by one or more carbon vacancy defects in the graphene monolayer such that the graphene monolayer may have substantially uniform defects throughout.

In various examples, the method of forming a membrane may further include configuring at least a portion of the gas sorbent at the surface of the graphene layer in the form of a plurality of gas sorbent nanoparticles. In some examples, the plurality of gas sorbent nanoparticles may be characterized by a diameter in a range from about 1 nanometer to about 250 nanometers. In further examples, the method may also include configuring at least a portion of the gas sorbent to include one or more of palladium, platinum, calcium oxide, magnesium oxide, magnesium salen, cobalt salen, and/or a permeable organic polymer. In various examples, palladium or a permeable organic polymer may be included in the gas sorbent layer.

In some examples, the method of forming a membrane may further include configuring at least a portion of the gas sorbent to include at least one atomic monolayer. In further examples, the method may also include configuring the gas sorbent at the surface of the graphene layer to have a thickness in a range from about 1 atom to about 1 micron in thickness. In various examples, the method may further include locating the gas sorbent at the surface of the graphene layer substantially between the plurality of nanoscale pores. In some examples, the method may further include configuring the gas sorbent at the surface of the graphene layer wherein at least a portion of the plurality of nanoscale pores may be substantially free from obstruction by the gas sorbent. In further examples, the method may also include occluding at least a portion of the plurality of nanoscale pores with the gas sorbent.

In various examples, the method of forming a membrane may also include contacting the gas sorbent to the surface of the graphene layer via one or more of: electrochemical deposition from a solution of the gas sorbent; chemical precipitation from a solution of the gas sorbent; dip coating, spin coating, contact printing, or jet coating of a suspension of gas sorbent nanoparticles; dip coating, spin coating, contact printing, or jet coating of a solution of soluble gas sorbent; atomic vapor deposition of the gas sorbent; atomic layer deposition of the gas sorbent; chemical vapor deposition of the gas sorbent; physical vapor deposition of the gas sorbent; and/or electrostatic deposition of particles of the gas sorbent.

An example method of separating a gas from a fluid mixture may include providing a fluid mixture that includes a first gas and a second gas. A molecule of the second gas may be larger than a molecule of the first gas. Some example methods of separating may also include providing a graphene layer that may be perforated by a plurality of nanoscale pores. Each of the nanoscale pores may be characterized by a diameter that may selectively facilitate passage of the first gas compared to the second gas. Various example methods of separating may further include increasing the surface concentration of the first gas at the graphene layer by contacting the fluid mixture to a gas sorbent at the graphene layer. Example methods of separating may also include selectively separating the first gas from the second gas according to size by employing the nanoscale pores perforated in the graphene layer.

In various examples, the method of separating a gas from a fluid mixture may also include directing the first gas through the plurality of nanoscale pores by applying a processing gradient across the graphene monolayer, wherein the processing gradient may correspond to one or more of a temperature gradient, a pressure gradient, a gas concentration gradient, or an electric field gradient. In some examples, a concentration of the first gas may be increased within about 1 micron of the graphene layer by the gas sorbent. In further examples, each of the plurality of nanoscale pores may be characterized by a diameter in a range from about 0.1 nanometers to about 4 nanometers. In various examples, at least a portion of the plurality of nanoscale pores may be substantially the same size such that the graphene layer may have substantially uniform pore sizes throughout. In some examples, each of the plurality of nanoscale pores may be characterized by the same number of one or more carbon vacancy defects in the graphene monolayer such that the graphene monolayer may have substantially uniform defects throughout. In further examples, the method of separating a gas from a fluid mixture may also include employing at least a portion of the gas sorbent in the form of a plurality of gas sorbent nanoparticles. In various examples, the plurality of gas sorbent nanoparticles may be characterized by a diameter in a range from about 1 nanometer to about 250 nanometers.

In some examples, the method of separating a gas from a fluid mixture may also include employing at least a portion of the gas sorbent to include one or more of palladium, platinum, calcium oxide, magnesium oxide, magnesium salen, cobalt salen, and/or a permeable organic polymer. In further examples, the method of separating a gas from a fluid mixture may also include locating the gas sorbent at the surface of the graphene layer substantially between the plurality of nanoscale pores. In various examples, the method of separating a gas from a fluid mixture may also include separating the first gas from the second gas at a separation selectivity of between about 200:1 and about 10^23:1. In some examples, the first gas may be one of helium, neon, argon, xenon, krypton, radon, hydrogen, nitrogen, oxygen, carbon monoxide, carbon dioxide, sulfur dioxide, hydrogen sulfide, a nitrogen oxide, a C1-C4 alkane, a silane, water, or a haloacid.

The present disclosure also generally describes an example computer-readable storage medium having example instructions stored thereon for making an example membrane. The example instructions may include providing a graphene layer that may be perforated by a plurality of nanoscale pores. Some example instructions may also include contacting a gas sorbent to a surface of the graphene layer via one or more of: electrochemical deposition from a solution of the gas sorbent; chemical precipitation from a solution of the gas sorbent; dip coating, spin coating, contact printing, or jet coating of a suspension of gas sorbent nanoparticles; dip coating, spin coating, contact printing, or jet coating of a solution of soluble gas sorbent; atomic vapor deposition of the gas sorbent; atomic layer deposition of the gas sorbent; chemical vapor deposition of the gas sorbent; physical vapor deposition of the gas sorbent; and/or electrostatic deposition of particles of the gas sorbent. Various examples may further include instructions for configuring the gas sorbent at the surface of the graphene layer to have a thickness in a range of about 1 atom to about 1 micron.

The terms "a" and "an" as used herein mean "one or more" unless the singular is expressly specified. For example, reference to "a base" may include a mixture of two or more bases, as well as a single base.

As used herein, "about" will be understood by persons of ordinary skill in the art and will vary to some extent depending upon the context in which "about" is used. If there are uses of the term which are not clear to persons of ordinary skill in the art, given the context in which the term is used, "about" will mean up to, plus or minus 10% of the particular term.

As used herein, the terms "optional" and "optionally" mean that the subsequently described circumstance may or may not occur, so that the description may include instances where the circumstance occurs and instances where it does not.

As used herein, "substituted" refers to an organic group as defined below (e.g., an alkyl group) in which one or more bonds to a hydrogen atom contained therein may be replaced by a bond to non-hydrogen or non-carbon atoms. Groups not explicitly stated to be one of substituted or unsubstituted may be either substituted or unsubstituted. Substituted groups also may include groups in which one or more bonds to a carbon(s) or hydrogen(s) atom may be replaced by one or more bonds, including double or triple bonds, to a heteroatom. A substituted group may be substituted with one or more substituents, unless otherwise specified. In some embodiments, a substituted group may be substituted with 1, 2, 3, 4, 5, or 6 substituents. Examples of substituent groups may include: halogens (i.e., F, Cl, Br, and I); hydroxyls; alkoxy, alkenoxy, aryloxy, aralkyloxy, heterocyclyloxy, and heterocyclylalkoxy groups; carbonyls (oxo); carboxyls; esters; urethanes; oximes; hydroxylamines; alkoxyamines; aralkoxyamines; thiols; sulfides; sulfoxides; sulfones; sulfonyls; sulfonamides; amines; N-oxides; hydrazines; hydrazides; hydrazones; azides; amides; ureas; amidines; guanidines; enamines; imides; iso-cyanates; iso-thiocyanates; cyanates; thiocyanates; imines; nitro groups; nitriles (i.e., CN); and the like.

Substituted ring groups such as substituted cycloalkyl, aryl, heterocyclyl and heteroaryl groups also may include rings and ring systems in which a bond to a hydrogen atom may be replaced with a bond to a carbon atom. Substituted cycloalkyl, aryl, heterocyclyl and heteroaryl groups may also be substituted with substituted or unsubstituted alkyl, alkenyl, and alkynyl groups as defined below.

Alkyl groups may include straight chain and branched chain alkyl groups having from 1 to 12 carbon atoms, and typically from 1 to 10 carbons or, in some examples, from 1 to 8, 1 to 6, or 1 to 4 carbon atoms. Examples of straight chain alkyl groups may include groups such as methyl, ethyl, n-propyl, n-butyl, n-pentyl, n-hexyl, n-heptyl, and n-octyl groups. Examples of branched alkyl groups may include, but are not limited to, iso-propyl, iso-butyl, sec-butyl, ten-butyl, neopentyl, iso-pentyl, and 2,2-dimethylpropyl groups. Representative substituted alkyl groups may be substituted one or more times with substituents such as those listed above and may include, without limitation, haloalkyl (e.g., trifluoromethyl), hydroxyalkyl, thioalkyl, aminoalkyl, alkylaminoalkyl, dialkylaminoalkyl, alkoxyalkyl, carboxyalkyl, and the like.

Cycloalkyl groups may include mono-, bi- or tricyclic alkyl groups having from 3 to 12 carbon atoms in the ring(s), or, in some embodiments, 3 to 10, 3 to 8, or 3 to 4, 5, or 6 carbon atoms. Exemplary monocyclic cycloalkyl groups may include, but are not limited to, cyclopropyl, cyclobutyl, cyclopentyl, cyclohexyl, cycloheptyl, and cyclooctyl groups. In some embodiments, the cycloalkyl group has 3 to 8 ring members, whereas in other embodiments, the number of ring carbon atoms ranges from 3 to 5, 3 to 6, or 3 to 7. Bi- and tricyclic ring systems may include both bridged cycloalkyl groups and fused rings, such as, but not limited to, bicyclo[2.1.1]hexane, adamantyl, decalinyl, and the like. Substituted cycloalkyl groups may be substituted one or more times with non-hydrogen and non-carbon groups as defined above. However, substituted cycloalkyl groups also may include rings that may be substituted with straight or branched chain alkyl groups as defined above. Representative substituted cycloalkyl groups may be mono-substituted or substituted more than once, such as, but not limited to, 2,2-, 2,3-, 2,4- 2,5- or 2,6-disubstituted cyclohexyl groups, which may be substituted with substituents such as those listed above.

Aryl groups may be cyclic aromatic hydrocarbons that do not contain heteroatoms. Aryl groups herein may include monocyclic, bicyclic and tricyclic ring systems. Aryl groups may include, but are not limited to, phenyl, azulenyl, heptalenyl, biphenyl, fluorenyl, phenanthrenyl, anthracenyl, indenyl, indanyl, pentalenyl, and naphthyl groups. In some embodiments, aryl groups contain 6-14 carbons, and in others from 6 to 12 or even 6-10 carbon atoms in the ring portions of the groups. In some embodiments, the aryl groups may be phenyl or naphthyl. "Aryl groups" may include groups containing fused rings, such as fused aromatic-aliphatic ring systems (e.g., indanyl, tetrahydronaphthyl, and the like). "Aryl groups", unless explicitly stated to be one of substituted or unsubstituted, may be either unsubstituted or substituted with other groups, such as alkyl or halo groups, bonded to one of the ring members. Representative substituted aryl groups may be mono-substituted or substituted more than once. For example, monosubstituted aryl groups include, but are not limited to, 2-, 3-, 4-, 5-, or 6-substituted phenyl or naphthyl groups, which may be substituted with substituents such as those listed above.

Aralkyl groups may be alkyl groups as defined above in which a hydrogen or carbon bond of an alkyl group may be replaced with a bond to an aryl group as defined above. In some embodiments, aralkyl groups contain 7 to 16 carbon atoms, 7 to 14 carbon atoms, or 7 to 10 carbon atoms. Substituted aralkyl groups may be substituted at the alkyl, the aryl or both the alkyl and aryl portions of the group. Representative aralkyl groups may include but are not limited to benzyl and phenethyl groups and fused (cycloalkylaryl)alkyl groups such as 4-indanylethyl. Representative substituted aralkyl groups may be substituted one or more times with substituents such as those listed above.

Heterocyclyl groups may include aromatic (also referred to as heteroaryl) and non-aromatic ring compounds containing 3 or more ring members of which one or more may be a heteroatom such as, but not limited to, N, O, and S. In some embodiments, the heterocyclyl group contains 1, 2, 3 or 4 heteroatoms. In some embodiments, heterocyclyl groups may include mono-, bi- and tricyclic rings having 3 to 16 ring members, whereas other such groups have 3 to 6, 3 to 10, 3 to 12, or 3 to 14 ring members. Heterocyclyl groups encompass aromatic, partially unsaturated and saturated ring systems, such as, for example, imidazolyl, imidazolinyl and imidazolidinyl groups. The phrase "heterocyclyl group" may include fused ring species including those comprising fused aromatic and non-aromatic groups, such as, for example, benzotriazolyl, 2,3-dihydrobenzo[1,4]dioxinyl, and benzo[1,3]dioxolyl. "Heterocyclyl group" also may include bridged polycyclic ring systems containing a heteroatom such as, but not limited to, quinuclidyl. A "Heterocyclyl group", unless explicitly stated to be one of substituted or unsubstituted, may be either unsubstituted or substituted with other groups, such as alkyl, oxo or halo groups, bonded to one of the ring members. Heterocyclyl groups may include, but are not limited to, aziridinyl, azetidinyl, pyrrolidinyl, imidazolidinyl, pyrazolidinyl, thiazolidinyl, tetrahydrothiophenyl, tetrahydrofuranyl, dioxolyl, furanyl, thiophenyl, pyrrolyl, pyrrolinyl, imidazolyl, imidazolinyl, pyrazolyl, pyrazolinyl, triazolyl, tetrazolyl, oxazolyl, iso-xazolyl, thiazolyl, thiazolinyl, iso-thiazolyl, thiadiazolyl, oxadiazolyl, piperidyl, piperazinyl, morpholinyl, thiomorpholinyl, tetrahydropyranyl, tetrahydrothiopyranyl, oxathiane, dioxyl, dithianyl, pyranyl, pyridyl, pyrimidinyl, pyridazinyl, pyrazinyl, triazinyl, dihydropyridyl, dihydrodithiinyl, dihydrodithionyl, homopiperazinyl, quinuclidyl, indolyl, indolinyl, iso-indolyl, azaindolyl (pyrrolopyridyl), indazolyl, indolizinyl, benzotriazolyl, benzimidazolyl, benzofuranyl, benzothiophenyl, benzthiazolyl, benzoxadiazolyl, benzoxazinyl, benzodithiinyl, benzoxathiinyl, benzothiazinyl, benzoxazolyl, benzothiazolyl, benzothiadiazolyl, benzo[1,3]dioxolyl, pyrazolopyridyl, imidazopyridyl (azabenzimidazolyl), triazolopyridyl, isoxazolopyridyl, purinyl, xanthinyl, adeninyl, guaninyl, quinolinyl, iso-quinolinyl, quinolizinyl, quinoxalinyl, quinazolinyl, cinnolinyl, phthalazinyl, naphthyridinyl, pteridinyl, thianaphthyl, dihydrobenzothiazinyl, dihydrobenzofuranyl, dihydroindolyl, dihydrobenzodioxinyl, tetrahydroindolyl, tetrahydroindazolyl, tetrahydrobenzimidazolyl, tetrahydrobenzotriazolyl, tetrahydropyrrolopyridyl, tetrahydropyrazolopyridyl, tetrahydroimidazopyridyl, tetrahydrotriazolopyridyl, and tetrahydroquinolinyl groups. Representative substituted heterocyclyl groups may be mono-substituted or substituted more than once, such as, but not limited to, pyridyl or morpholinyl groups, which may be 2, 3-, 4-, 5-, or 6-substituted, or disubstituted with various substituents such as those listed above.

Heteroaryl groups may be aromatic ring compounds containing 5 or more ring members, of which one or more may be a heteroatom such as, but not limited to, N, O, and S. Heteroaryl groups include, but are not limited to, groups such as pyrrolyl, pyrazolyl, triazolyl, tetrazolyl, oxazolyl, iso-xazolyl, thiazolyl, pyridinyl, pyridazinyl, pyrimidinyl, pyrazinyl, thiophenyl, benzothiophenyl, furanyl, benzofuranyl, indolyl, azaindolyl (pyrrolopyridinyl), indazolyl, benzimidazolyl, imidazopyridinyl (azabenzimidazolyl), pyrazolopyridinyl, triazolopyridinyl, benzotriazolyl, benzoxazolyl, benzothiazolyl, benzothiadiazolyl, imidazopyridinyl, isoxazolopyridinyl, thianaphthyl, purinyl, xanthinyl, adeninyl, guaninyl, quinolinyl, iso-quinolinyl, tetrahydroquinolinyl, quinoxalinyl, and quinazolinyl groups. Heteroaryl groups include fused ring compounds in which rings may be aromatic such as indolyl groups and include fused ring compounds in which only one of the rings may be aromatic, such as 2,3-dihydro indolyl groups. "Heteroaryl groups" may include fused ring compounds. "Heteroaryl groups" unless explicitly stated to be substituted or to be unsubstituted, may be either unsubstituted or substituted with other groups bonded to one of the ring members, such as alkyl groups. Representative substituted heteroaryl groups may be substituted one or more times with various substituents such as those listed above.

Heteroaralkyl groups may be alkyl groups as defined above in which a hydrogen or carbon bond of an alkyl group may be replaced with a bond to a heteroaryl group as defined above. Substituted heteroaralkyl groups may be substituted at the alkyl, the heteroaryl or both the alkyl and heteroaryl portions of the group. Representative substituted heteroaralkyl groups may be substituted one or more times with substituents such as those listed above.

Groups described herein having two or more points of attachment (i.e., divalent, trivalent, or polyvalent) within the compound of the technology may be designated by use of the suffix, "ene." For example, divalent alkyl groups may be alkylene groups, divalent aryl groups may be arylene groups, divalent heteroaryl groups may be heteroarylene groups, and so forth.

Alkoxy groups may be hydroxyl groups (—OH) in which the bond to the hydrogen atom may be replaced by a bond to a carbon atom of a substituted or unsubstituted alkyl group as defined above. Examples of linear alkoxy groups include, but are not limited to, methoxy, ethoxy, propoxy, butoxy, pentoxy, hexoxy, and the like. Examples of branched alkoxy groups include, but are not limited to, iso-propoxy, sec-butoxy, tert-butoxy, iso-pentoxy, iso-hexoxy, and the like. Examples of cycloalkoxy groups include, but are not limited to, cyclopropyloxy, cyclobutyloxy, cyclopentyloxy, cyclohexyloxy, and the like. Representative substituted alkoxy groups may be substituted one or more times with substituents such as those listed above.

The term "amine" (or "amino"), as used herein, refers to $NR_5R_6$ groups, wherein $R_5$ and $R_6$ may be independently hydrogen, or a substituted or unsubstituted alkyl, alkenyl, alkynyl, cycloalkyl, aryl, aralkyl, heterocyclylalkyl or heterocyclyl group as defined herein. In some embodiments, the amine may be alkylamino, dialkylamino, arylamino, or alkylarylamino. In other embodiments, the amine may be $NH_2$, methylamino, dimethylamino, ethylamino, diethylamino, propylamino, iso-propylamino, phenylamino, or benzylamino. The term "alkylamino" may be defined as $NR_7R_8$, wherein at least one of $R_7$ and $R_8$ may be alkyl and the other may be alkyl or hydrogen. The term "arylamino" may be defined as $NR_9R_{10}$, wherein at least one of $R_9$ and $R_{10}$ may be aryl and the other may be aryl or hydrogen.

The term "halogen" or "halo," as used herein, refers to bromine, chlorine, fluorine, or iodine. In some embodiments, the halogen may be fluorine. In other embodiments, the halogen may be chlorine or bromine.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical manufacturing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group. As will be understood by one skilled in the art, for any and all purposes, such as in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. Finally, as will be understood by one skilled in the art, a range includes each individual member. For example, a group having 1-3 cells refers to groups having 1, 2, or 3 cells. Similarly, a group having 1-5 cells refers to groups having 1, 2, 3, 4, or 5 cells, and so forth. While various aspects and embodiments have been disclosed herein, other aspects and embodiments will be apparent to those skilled in the art.

The various aspects and embodiments disclosed herein are for purposes of illustration and are not intended to be limiting, with the true scope and spirit being indicated by the following claims.

What is claimed is:

1. A membrane, comprising:
  a graphene layer perforated by a plurality of nanoscale pores; and
  a gas sorbent comprising a material perforated by a plurality of gas sorbent pores, wherein the material contacts a surface of the graphene layer such that at least one portion of the plurality of nanoscale pores and at least one portion of the plurality of gas sorbent pores are aligned and the at least one portion of the plurality of nanoscale pores is free from obstruction by the material, wherein the material adsorbs at least one gas and is permeable to the adsorbed at least one gas such that the gas sorbent is configured to direct the at least one gas into the plurality of nanoscale pores, and wherein a hydrogen and methane separation selectivity of the membrane is between about 200:1 and about $10^{2}3:1$.

2. The membrane of claim 1, wherein the plurality of nanoscale pores have an average diameter in a range from about 0.1 nanometers to about 4 nanometers.

3. The membrane of claim 1, wherein the plurality of nanoscale pores are substantially a same size such that the graphene layer has substantially uniform pore sizes throughout.

4. The membrane of claim 3, wherein each of the plurality of nanoscale pores includes one or more carbon vacancy defects in the graphene layer such that the graphene layer has substantially uniform defects throughout.

5. The membrane of claim 1, wherein the gas sorbent comprises a plurality of nanoparticles that have a diameter in a range from about 1 nanometer to about 250 nanometers.

6. The membrane of claim 1, wherein the material comprises one or more of platinum, calcium oxide, magnesium oxide, magnesium salen, and cobalt salen.

7. The membrane of claim 1, wherein the material comprises at least one of palladium or a permeable organic polymer.

8. The membrane of claim 1, wherein the gas sorbent comprises at least one atomic monolayer.

9. The membrane of claim 8, wherein the gas sorbent at the surface of the graphene layer is in a range between about 1 atom and about 1 micron in thickness.

10. The membrane of claim 1, wherein the gas sorbent comprises palladium nanoparticles with an average diameter in a range from about 20 nanometers to about 100 nanometers.

11. The membrane of claim 1, wherein the gas sorbent excludes gold nanoparticles.

12. A method to form a membrane, comprising:
providing a graphene layer perforated by a plurality of nanoscale pores;
providing a gas sorbent comprising a material perforated by a plurality of gas sorbent pores; and
contacting the gas sorbent to a surface of the graphene layer such that at least one portion of the plurality of nanoscale pores and at least one portion of the plurality of gas sorbent pores are aligned and the at least one portion of the plurality of nanoscale pores is free from obstruction by the material, wherein the material increases a surface concentration of at least one gas at the surface of the graphene layer, wherein the material adsorbs the at least one gas and is permeable to the adsorbed at least one gas such that the gas sorbent is configured to direct the at least one gas into the plurality of nanoscale pores, and wherein a hydrogen and methane separation selectivity of the membrane is between about 200:1 and about $10^{2}3:1$.

13. The method of claim 12, wherein contacting the gas sorbent to the surface of the graphene layer includes applying at least a portion of the gas sorbent at the surface of the graphene layer as a plurality of gas sorbent nanoparticles.

14. The method of claim 12, further comprising occluding at least another portion of the plurality of nanoscale pores with the material.

15. The method of claim 12, wherein contacting the gas sorbent to the surface of the graphene layer includes contacting the gas sorbent to the surface of the graphene layer via one or more of: electrochemical deposition from a solution of the gas sorbent; chemical precipitation from a solution of the gas sorbent; dip coating, spin coating, contact printing, or jet coating of a suspension of gas sorbent nanoparticles; dip coating, spin coating, contact printing, or jet coating of a solution of soluble gas sorbent; atomic vapor deposition of the was sorbent; atomic layer deposition of the gas sorbent; chemical vapor deposition of the gas sorbent; physical vapor deposition of the gas sorbent; and/or electrostatic deposition of particles of the gas sorbent.

16. A method to separate a gas from a fluid mixture, comprising:
providing a fluid mixture that includes a first gas and a second gas, wherein a molecule of the second gas is larger than a molecule of the first gas;
providing a graphene layer perforated by a plurality of nanoscale pores, wherein each of the plurality of nanoscale pores has a diameter that selectively facilitates passage of the first gas compared to the second gas;
providing a gas sorbent that comprises a material perforated by a plurality of gas sorbent pores, wherein the material contacts a surface of the graphene layer such that at least one portion of the plurality of nanoscale pores and at least one portion of the plurality of gas sorbent pores are aligned and the at least one portion of the plurality of nanoscale ores is free from obstruction by the material;
increasing a concentration of the first gas at the surface of the graphene layer by contacting the fluid mixture to the gas sorbent at the graphene layer, wherein the material adsorbs the first gas and is permeable to the first gas such that the gas sorbent is configured to direct the first gas into the plurality of nanoscale pores; and
selectively separating the first gas from the second gas according to size by employing the plurality of nanoscale pores perforated in the graphene layer, wherein a hydrogen and methane separation selectivity is between about 200:1 and about $10^{2}3:1$.

17. The method of claim 16, wherein selectively separating the first gas from the second gas includes directing the first gas through the plurality of nanoscale pores by applying a processing gradient across the graphene layer, wherein the processing, gradient corresponds to one or more of a temperature gradient, a pressure gradient, a gas concentration gradient, or an electric field gradient.

18. The method of claim 16, wherein increasing the concentration of the first gas at the surface of the graphene layer includes increasing a concentration of the first gas within about 1 micron of the graphene layer.

* * * * *

UNITED STATES PATENT AND TRADEMARK OFFICE
CERTIFICATE OF CORRECTION

| | | |
|---|---|---|
| PATENT NO. | : 9,545,600 B2 | Page 1 of 1 |
| APPLICATION NO. | : 14/703730 | |
| DATED | : January 17, 2017 | |
| INVENTOR(S) | : Miller et al. | |

It is certified that error appears in the above-identified patent and that said Letters Patent is hereby corrected as shown below:

In the Specification

In Column 1, Line 8, delete "§120" and insert -- § 120 --, therefor.

In Column 1, Line 10, delete "§371" and insert -- § 371 --, therefor.

In Column 15, Line 38, delete "by" and insert -- by: --, therefor.

In Column 32, Line 64, delete "ten-butyl," and insert -- tert-butyl, --, therefor.

In the Claims

In Column 40, Line 16, in Claim 15, delete "was sorbent;" and insert -- gas sorbent; --, therefor.

In Column 40, Line 37, in Claim 16, delete "ores" and insert -- pores --, therefor.

In Column 40, Line 53, in Claim 17, delete "processing," and insert -- processing --, therefor.

Signed and Sealed this
Twenty-fifth Day of April, 2017

Michelle K. Lee
*Director of the United States Patent and Trademark Office*